United States Patent
Kohno et al.

(10) Patent No.: US 8,114,790 B2
(45) Date of Patent: Feb. 14, 2012

(54) PLASMA CVD METHOD, SILICON NITRIDE FILM FORMATION METHOD, SEMICONDUCTOR DEVICE MANUFACTURING METHOD, AND PLASMA CVD APPARATUS

(75) Inventors: Masayuki Kohno, Amagasaki (JP); Tatsuo Nishita, Amagasaki (JP); Toshio Nakanishi, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 87 days.

(21) Appl. No.: 12/302,614

(22) PCT Filed: May 30, 2007

(86) PCT No.: PCT/JP2007/060976
§ 371 (c)(1),
(2), (4) Date: Nov. 26, 2008

(87) PCT Pub. No.: WO2007/139142
PCT Pub. Date: Dec. 6, 2007

(65) Prior Publication Data
US 2009/0203228 A1 Aug. 13, 2009

(30) Foreign Application Priority Data
May 31, 2006 (JP) .................................. 2006-152434

(51) Int. Cl.
*H01L 21/31* (2006.01)
*H01L 21/469* (2006.01)
(52) U.S. Cl. ................. 438/792; 257/E21.493; 118/696
(58) Field of Classification Search .................... 438/792
See application file for complete search history.

(56) References Cited

U.S. PATENT DOCUMENTS

| 5,592,004 | A  | * | 1/1997 | Tamura et al. ................ 257/323 |
| 6,470,824 | B2 | * | 10/2002 | Kawakami et al. ..... 118/723 AN |
| 6,897,149 | B2 | * | 5/2005 | Sugawara et al. ............ 438/680 |
| 2007/0090455 | A1 | * | 4/2007 | Lim et al. ...................... 257/338 |
| 2008/0160339 | A1 | * | 7/2008 | Ito et al. ........................ 428/688 |

FOREIGN PATENT DOCUMENTS

| JP | 11 340221 | 12/1999 |
| JP | 2000 260767 | 9/2000 |
| JP | 2005 93737 | 4/2005 |
| JP | 2006 80161 | 3/2006 |

OTHER PUBLICATIONS

Office Action issued Dec. 21, 2010, in China Patent Application No. 200780019181.0 (with partial English translation).

* cited by examiner

*Primary Examiner* — Matthew Landau
*Assistant Examiner* — Sonya McCall Shepard
(74) *Attorney, Agent, or Firm* — Oblon, Spivak, McClelland, Maier & Neustadt, L.L.P.

(57) ABSTRACT

A plasma processing apparatus includes a process chamber configured to be vacuum-exhausted; a worktable configured to place a target substrate thereon inside the process chamber; a microwave generation source configured to generate microwaves; a planar antenna including a plurality of slots and configured to supply microwaves generated by the microwave generation source through the slots into the process chamber; a gas supply mechanism configured to supply a film formation source gas into the process chamber; and an RF power supply configured to apply an RF power to the worktable. The apparatus is preset to turn a nitrogen-containing gas and a silicon-containing gas supplied in the process chamber into plasma by the microwaves, and to deposit a silicon nitride film on a surface of the target substrate by use of the plasma, while applying the RF power to the worktable.

13 Claims, 13 Drawing Sheets

PLASMA CVD METHOD, SILICON NITRIDE FILM FORMATION METHOD, SEMICONDUCTOR DEVICE MANUFACTURING METHOD, AND PLASMA CVD APPARATUS

TECHNICAL FIELD

The present invention relates to a plasma CVD (Chemical Vapor Deposition) method, a silicon nitride film formation method and a semiconductor device manufacturing method which utilize the plasma CVD method, and a plasma CVD apparatus used for processes of this kind.

BACKGROUND ART

Silicon nitride films are used as insulating films, protection films, and so forth in various semiconductor devices. It is known to form a silicon nitride film of this kind by use of a plasma CVD method, which employs a silicon-containing compound gas serving as a source gas, such as silane ($SiH_4$), and a nitrogen-containing compound gas, such as nitrogen or ammonia, (for example, Jpn. Pat. Appln. KOKAI Publication No. 2000-260767).

Where a silicon nitride films is formed by a conventional plasma CVD method, an important study subject is suppression of film stress that causes ill effects on device characteristics, i.e., tensile stress and compressive stress. For example, it is known that, where a silicon nitride film has a large compressive stress, stress migration occurs and causes disconnection of a metal interconnection line directly below the film due to the stress. Accordingly, such a compressive stress should be decreased to prevent this problem. In the case of plasma CVD methods, the direction of stress in a silicon nitride film (whether it is tensile stress or compressive stress) and the degree thereof are determined on the basis of film formation conditions, such as pressure, temperature, and film formation gas type. Conventional, where a silicon nitride film is formed by a plasma CVD method, the film formation conditions are set to prevent a strong stress from being generated in the film (for example, Kazuo Maeda, "VLSI and CVD", Maki Shoten (publisher), Jul. 31, 1997).

In recent years, attempts have been made for some sorts of devices to improve device characteristics by positively utilizing stress in silicon nitride films. However, for example, plasma CVD apparatuses of the parallel-plate type and of the inductive coupling type use plasma having a relatively high electron temperature. In this case, if a process condition, such as the RF (radio frequency) output, pressure, or temperature, is changed to introduce a high stress, the film formation conditions fall in a state that causes plasma damage to a silicon nitride film formed by the process. This makes it difficult to form a silicon nitride film of high quality in apparatuses of these types. Accordingly, formation of a film with a high stress is difficult. Further, due to a narrow range of selection of plasma process conditions, control of the stress with high accuracy is also difficult.

DISCLOSURE OF INVENTION

An object of the present invention is to provide a plasma CVD method that can form a silicon nitride film to have a high stress while being less damaged by plasma.

Another object of the present invention is to provide a silicon nitride film formation method that can generate a predetermined stress by use of plasma CVD of this kind.

Another object of the present invention is to provide a semiconductor device manufacturing method that utilizes a silicon nitride film of this kind.

Another object of the present invention is to provide a plasma CVD apparatus that can perform the plasma CVD method described above.

According to a first aspect of the present invention, there is provided a plasma CVD method comprising: preparing a plasma processing apparatus which comprises a process chamber configured to be vacuum-exhausted, a worktable configured to place a target substrate thereon inside the process chamber, a microwave generation source configured to generate microwaves, a planar antenna including a plurality of slots and configured to supply microwaves generated by the microwave generation source through the slots into the process chamber, a gas supply mechanism configured to supply a film formation source gas into the process chamber, and an RF power supply configured to apply an RF power to the worktable; placing the target substrate on the worktable; supplying a nitrogen-containing gas and a silicon-containing gas into the process chamber, turning these gases into plasma by the microwaves, and depositing a silicon nitride film on a surface of the target substrate by use of the plasma; and applying the RF power to the worktable while depositing the silicon nitride film.

According to a second aspect of the present invention, there is provided a silicon nitride film formation method comprising: preparing a plasma processing apparatus which comprises a process chamber configured to be vacuum-exhausted, a worktable configured to place a target substrate thereon inside the process chamber, a microwave generation source configured to generate microwaves, a planar antenna including a plurality of slots and configured to supply microwaves generated by the microwave generation source through the slots into the process chamber, a gas supply mechanism configured to supply a film formation source gas into the process chamber, and an RF power supply configured to apply an RF power to the worktable; placing the target substrate on the worktable; supplying a nitrogen-containing gas and a silicon-containing gas into the process chamber, turning these gases into plasma by the microwaves, and depositing a silicon nitride film on a surface of the target substrate by use of the plasma; and applying the RF power to the worktable while depositing the silicon nitride film.

In the first and second aspects, the RF power may be selected to have a power density of 0.0032 to 1.59 $W/cm^2$ and a frequency of 400 kHz to 27 MHz. The method may be arranged to form a silicon nitride film having a compressive stress of 1,000 MPa or more. In this case, the method is preferably arranged to use a process pressure of 0.1 Pa or more and 53 Pa or less in depositing the silicon nitride film. The method may be arranged to form a silicon nitride film having a compressive stress of 2,000 MPa or more. In this case, the method is preferably arranged to use a process pressure of 0.1 Pa or more and 40 Pa or less in depositing the silicon nitride film. The method may be arranged to form a silicon nitride film having a compressive stress of 3,000 MPa or more. In this case, the method is preferably arranged to use a process pressure of 5 Pa or more and 25 Pa or less in depositing the silicon nitride film, and the RF power preferably has a power density of 0.016 to 0.127 $W/cm^2$. The method may be arranged to form a silicon nitride film having a compressive stress of 3,500 MPa or more. In this case, the method is preferably arranged to use a process pressure of 7 Pa or more and 16 Pa or less in depositing the silicon nitride film, and the RF power preferably has a power density of 0.032 to 0.095 $W/cm^2$.

The nitrogen-containing gas may be ammonia gas or nitrogen gas. The silicon-containing gas may be disilane ($Si_2H_6$). The method may be arranged to use a process temperature of 300° C. to 800° C. in depositing the silicon nitride film.

According to a third aspect of the present invention, there is provided a semiconductor device manufacturing method comprising preparing a structure including a gate electrode formed on an insulating film on a main surface of a semiconductor substrate, and a source and a drain formed in the main surface one on either side of the gate electrode, and forming a silicon nitride film to cover the gate electrode and the source and drain, wherein the silicon nitride film is formed by a method comprising: preparing a plasma processing apparatus which comprises a process chamber configured to be vacuum-exhausted, a worktable configured to place a target substrate thereon inside the process chamber, a microwave generation source configured to generate microwaves, a planar antenna including a plurality of slots and configured to supply microwaves generated by the microwave generation source through the slots into the process chamber, and a gas supply mechanism configured to supply a film formation source gas into the process chamber; placing the target substrate on the worktable; supplying a nitrogen-containing gas and a silicon-containing gas into the process chamber, turning these gases into plasma by the microwaves, and depositing a silicon nitride film on a surface of the target substrate by use of the plasma; and applying an RF power to the worktable while depositing the silicon nitride film.

According to a fourth aspect of the present invention, there is provided a storage medium that stores a program for execution on a computer to control a plasma processing apparatus which comprises a process chamber configured to be vacuum-exhausted, a worktable configured to place a target substrate thereon inside the process chamber, a microwave generation source configured to generate microwaves, a planar antenna including a plurality of slots and configured to supply microwaves generated by the microwave generation source through the slots into the process chamber, a gas supply mechanism configured to supply a film formation source gas into the process chamber, and an RF power supply configured to apply an RF power to the worktable, wherein, when executed, the program causes the computer to control the plasma processing apparatus to conduct a plasma CVD method comprising: placing the target substrate on the worktable; supplying a nitrogen-containing gas and a silicon-containing gas into the process chamber, turning these gases into plasma by the microwaves, and depositing a silicon nitride film on a surface of the target substrate by use of the plasma; and applying the RF power to the worktable while depositing the silicon nitride film.

According to a fifth aspect of the present invention, there is provided a plasma processing apparatus comprising: a process chamber configured to be vacuum-exhausted; a worktable configured to place a target substrate thereon inside the process chamber; a microwave generation source configured to generate microwaves; a planar antenna including a plurality of slots and configured to supply microwaves generated by the microwave generation source through the slots into the process chamber; a gas supply mechanism configured to supply a film formation source gas into the process chamber; an RF power supply configured to apply an RF power to the worktable; and a control section preset to perform a plasma CVD method comprising placing the target substrate on the worktable, supplying a nitrogen-containing gas and a silicon-containing gas into the process chamber, turning these gases into plasma by the microwaves, and depositing a silicon nitride film on a surface of the target substrate by use of the plasma, and applying the RF power to the worktable while depositing the silicon nitride film.

According to a sixth aspect of the present invention, there is provided a plasma CVD apparatus comprising: a process chamber configured to be vacuum-exhausted and to process a target substrate by use of plasma; a worktable configured to place a target substrate thereon inside the process chamber; a planar antenna including a plurality of slots configured to supply microwaves into the process chamber; a gas supply mechanism configured to supply a film formation source gas into the process chamber; and an RF power supply configured to apply an RF power to the worktable.

According to the present invention, a plasma processing apparatus comprising: a process chamber configured to be vacuum-exhausted; a worktable configured to place a target substrate thereon inside the process chamber; a microwave generation source configured to generate microwaves; a planar antenna including a plurality of slots and configured to supply microwaves generated by the microwave generation source through the slots into the process chamber; a gas supply mechanism configured to supply a film formation source gas into the process chamber; and an RF power supply configured to apply an RF power to the worktable. The plasma processing apparatus is preset to apply an RF power to the worktable while depositing a silicon nitride film, thereby forming a silicon nitride film having a high compressive stress of, e.g., 1,000 MPa or more, preferably of 2,000 MPa or more, more preferably of 3,000 MPa or more, furthermore preferably of 3,500 MPa or more. This effect can be obtained regardless of the type of the film formation gas.

Further, where a plasma processing apparatus comprises a planar antenna including a plurality of slots configured to supply microwaves into a process chamber to generate plasma, a plasma process can be performed with a low electron temperature and a high density, and so plasma damage is decreased to the minimum in plasma CVD. Accordingly, the plasma processing apparatus has broad options of plasma CVD conditions, such as the nitrogen-containing gas type and process pressure, and so the controllability of the stress in a silicon nitride film is improved.

As described above, a plasma CVD method according to the present invention can provide a silicon nitride film with a high compressive stress and less plasma damage, and so the method can be effectively utilized to form a silicon nitride film having a stress in the process of manufacturing various semiconductor devices.

BEST MODE FOR CARRYING OUT THE INVENTION

Figure 1:
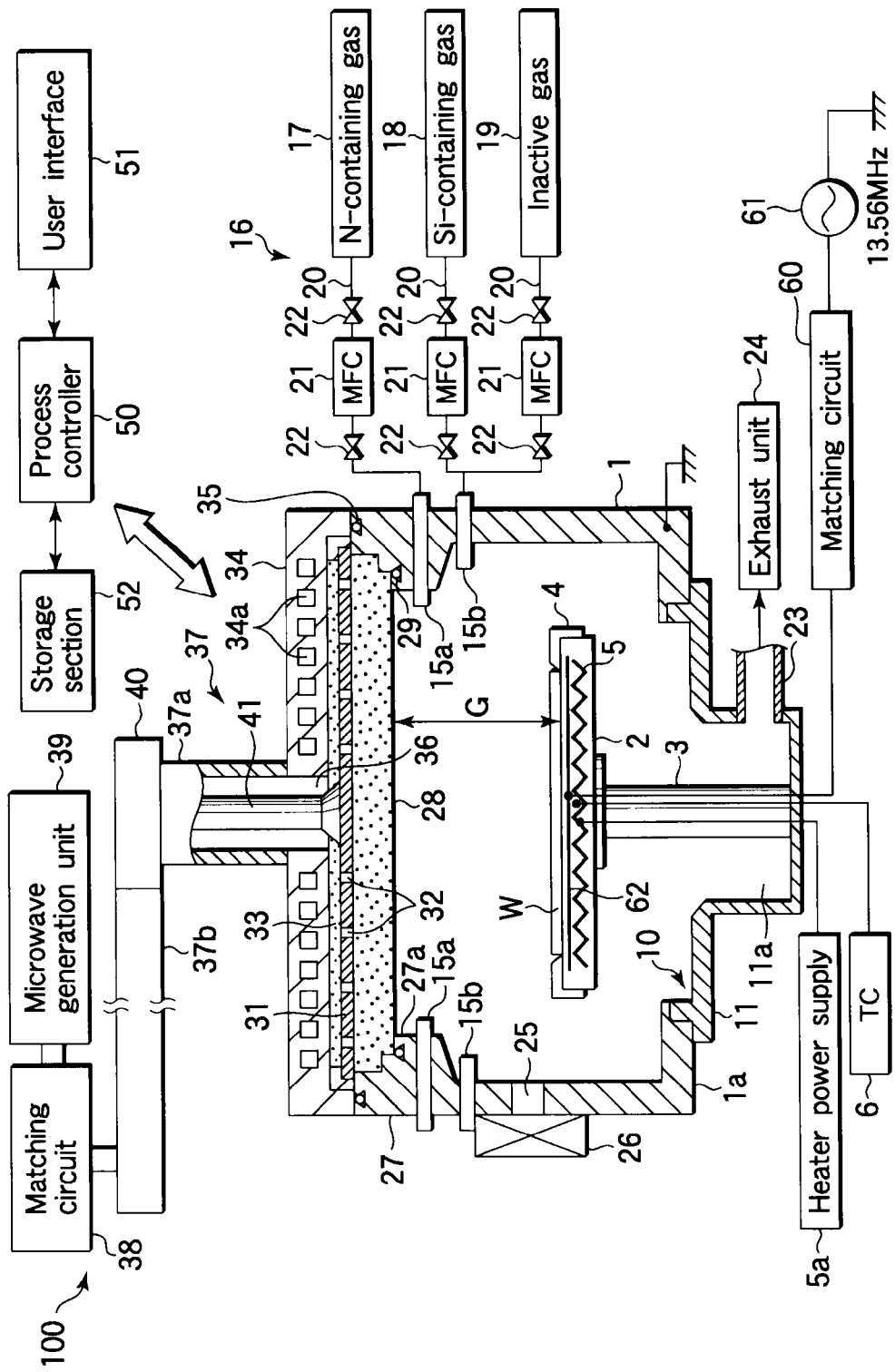
FIG. 1 This is a sectional view schematically showing an example of a plasma processing apparatus suitable for performing a method according to the present invention.

An embodiment of the present invention will now be described with reference to the accompanying drawings. FIG. 1 is a sectional view schematically showing an example of a plasma processing apparatus suitable for forming a silicon nitride film according to the present invention. This plasma processing apparatus 100 is arranged as a processing apparatus of the RLSA (Radial Line Slot Antenna) microwave plasma type, in which microwaves are supplied from a planar antenna having a plurality of slots into a process chamber to generate plasma. In this case, microwave excitation plasma is generated with a high plasma density and a low electron temperature, such as a plasma density of $1\times10^{10}$ to $5\times10^{12}/cm^3$ and an electron temperature of 0.7 to 2 eV, to perform a plasma process. Accordingly, apparatuses of this type are preferably utilized for processes, such as formation of a silicon nitride film by plasma CVD, in manufacturing various semiconductor devices.

This plasma processing apparatus 100 includes an essentially cylindrical chamber 1, which is airtight and grounded. The chamber 1 may be formed of a rectangular column. The bottom wall 1a of the chamber 1 has a circular opening 10 formed essentially at the center, and is provided with an exhaust chamber 11 communicating with the opening 10 and extending downward. The exhaust chamber 11 is connected to an exhaust unit 24 through an exhaust line 23.

The chamber 1 is provided with a worktable 2 disposed therein and made of a ceramic with a high thermal conductivity, such as AlN, for supporting a target substrate, such as a silicon wafer (which will be simply referred to as "wafer", hereinafter) W, in a horizontal state. The worktable 2 is supported by a cylindrical support member 3 made of a ceramic, such as AlN, and extending upward from the center of the bottom of the exhaust chamber 11. The worktable 2 is provided with a cover ring 4 covering the outer edge of the worktable 2 and configured to guide the wafer W. The cover ring 4 is a member made of a material, such as quartz, AlN, $Al_2O_3$, or SiN.

The worktable 2 is provided with a heater 5 of the resistance heating type embedded therein. The heater 5 is supplied with a power from a heater power supply 5a to heat the worktable 2, thereby uniformly heating the target substrate or wafer W. Further, a thermocouple 6 is connected to the worktable 2, so that heating temperature for the wafer W can be controlled within a range of, e.g., from room temperature to 900° C. The worktable 2 is provided with wafer support pins (not shown) that can project and retreat relative to the surface of the worktable 2 to support the wafer W and move it up and down.

The worktable 2 is connected to RF power supply 61 for bias application through a matching circuit 60. The RF power supply 61 is preset to apply an RF power having a predetermined frequency of, e.g., 400 kHz to 27 MHz, such as 400 kHz or 13.56 MHz, and a power level of 1 to 500 W to an electrode 62 embedded in the worktable 2. The electrode 62 is formed of, e.g., a meshed member made of an electrically conductive material, such as molybdenum or tungsten. According to the present invention, an RF power is applied to the worktable 2 at a predetermined output level, so that a silicon nitride film is formed to have a strong compressive stress, as described later.

Gas feed members 15a and 15b having an annular structure are attached to the sidewall of an upper plate 27 and the chamber 1 on upper and lower sides, respectively, as described later. The gas feed members 15a and 15b are connected to a gas supply system 16 for supplying a film formation source gas and a plasma excitation gas. Each of the gas feed members 15a and 15b may have a nozzle or shower structure.

For example, the gas supply system 16 includes a nitrogen-containing gas supply source 17, an Si-containing gas supply source 18, and an inactive gas supply source 19. The nitrogen-containing gas supply source 17 is connected to the upper gas feed member 15a, the Si-containing gas supply source 18 and inactive gas supply source 19 are connected to the lower gas feed member 15b.

The nitrogen-containing gas used as a film formation source gas is $N_2$, ammonia, or MMH (monomethylhydrazine), for example.

The Si-containing gas used as another film formation source gas is silane ($SiH_4$), disilane ($Si_2H_6$), or trisilylamine [$(SiH_3)_3N$], for example, and particularly preferably disilane ($Si_2H_6$).

The inactive gas is $N_2$ gas or rare gas, for example. The rare gas used as a plasma excitation gas is Ar gas, Kr gas, Xe gas, or He gas, for example, and particularly preferably Ar gas.

The nitrogen-containing gas is supplied through a gas line 20 to the gas feed member 15a, and is delivered from the gas feed member 15a into the chamber 1. On the other hand, the Si-containing gas and inactive gas are supplied through respective gas lines 20 to the gas feed member 15b, and are delivered from the gas feed member 15b into the chamber 1. Each of the gas lines 20 connected to the respective gas supply sources is provided with a mass-flow controller 21 and two switching valves 22 one on either side of the controller 21 to switch gases to be supplied and to control the flow rate of each gas. The plasma excitation rare gas, such as Ar, is not essential, and thus it is not necessary supplied along with the film formation source gas.

The sidewall of the exhaust chamber 11 is connected to an exhaust unit 24 including a high speed vacuum pump through an exhaust line 23. The exhaust unit 24 can be operated to uniformly exhaust gas from inside the chamber 1 through a passage around and blow the worktable 2 into the space 11a of the exhaust chamber 11, and then out of the exhaust chamber 11 through the exhaust line 23. Consequently, the inner pressure of the chamber 1 can be decreased at a high speed to a predetermined vacuum level, such as 0.133 Pa.

The chamber 1 has a transfer port 25 formed in the sidewall and provided with a gate valve 26 for opening/closing the transfer port 25. The wafer W is transferred between the plasma processing apparatus 100 and an adjacent transfer chamber (not shown) through the transfer port 25.

The top of the chamber 1 is opened and connected to an annular upper plate 27 formed along the opening. The lower side of the inner periphery of the upper plate 27 projects inward into the space inside the chamber and forms an annular support portion 27a. A microwave transmission plate 28 is airtightly mounted on the support portion 27a through a seal member 29. The microwave transmission plate 28 is made of a dielectric material, such as quartz or a ceramic, e.g., $Al_2O_3$ or AlN, to transmit microwaves. The interior of the chamber 1 is thus held airtight.

A circular planar antenna member 31 is disposed above the transmission plate 28 to face the worktable 2. The planar antenna member 31 may be formed of a rectangular plate in place of the circular plate. The planar antenna member 31 is fixed to the top of the sidewall of the chamber 1. The planar antenna member 31 is formed of, e.g., a copper plate or aluminum plate with the surface plated with gold or silver. The planar antenna member 31 has a number of slot-like microwave radiation holes 32 for radiating microwaves, formed therethrough and arrayed in a predetermined pattern.

Figure 2:
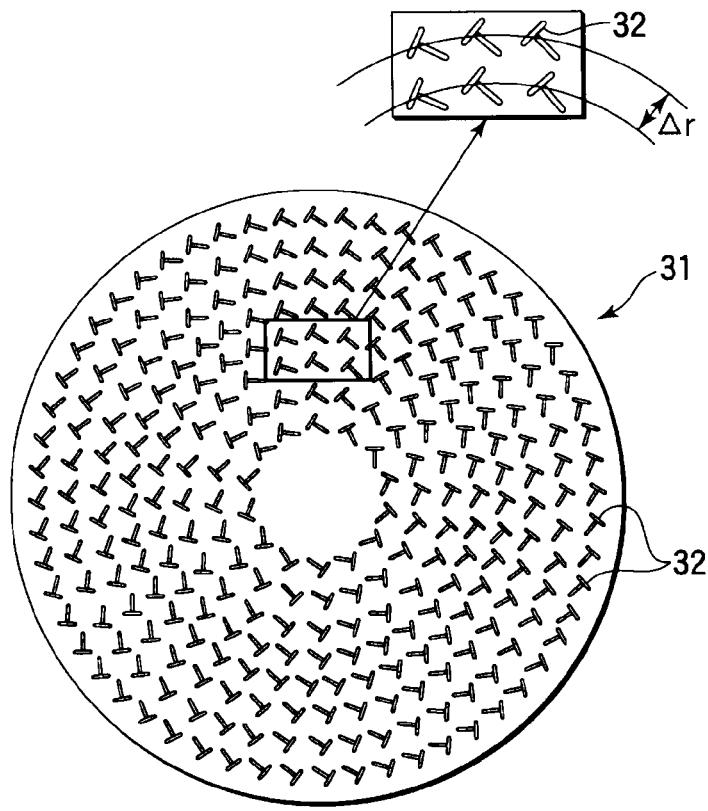
FIG. 2 This is a plan view showing a planar antenna member used in the plasma processing apparatus shown in FIG. 1.

For example, as shown in FIG. 2, the microwave radiation holes 32 have a long narrow shape and are arranged to form a number of pairs of holes 32, wherein the microwave radiation holes 32 are typically arranged such that the pairs of holes 32 form T-shapes and are arrayed on a plurality of concentric circles. The length and array intervals of the microwave radiation holes 32 are determined in accordance with the wavelength ($\lambda g$) of microwaves inside a waveguide tube 37. For example, the intervals of the microwave radiation holes 32 are set to be $\lambda g/4$, $\lambda g/2$, or $\lambda g$. In FIG. 2, the interval between adjacent microwave radiation holes 32 respectively on two concentric circles is expressed with $\Delta r$. The microwave radiation holes 32 may have another shape, such as a circular shape or arc shape. The array pattern of the microwave radiation holes 32 is not limited to a specific one, and, for example, it may be spiral or radial other than concentric.

A wave-retardation body 33 having a dielectric constant larger than that of vacuum is disposed on the top of the planar antenna member 31. The wave-retardation body 33 shortens the wavelength of microwaves to adjust plasma, because the wavelength of microwaves becomes longer in a vacuum condition. The planar antenna member 31 may be set in contact with or separated from the transmission plate 28. Similarly, the wave-retardation body 33 may be set in contact with or separated from the planar antenna member 31. However, these members are preferably set in contact with the adjacent one.

The planar antenna member 31 and wave-retardation body 33 are covered with the shield lid 34 located at the top of the chamber 1 and made of a metal material, such as aluminum or stainless steel. A seal member 35 is interposed between the top of the chamber 1 and the shield lid 34 to seal this portion. The shield lid 34 is provided with a plurality of cooling water passages 34a formed therein. Cooling water is supplied to flow through the cooling water passages and thereby cool the shield lid 34, wave-retardation body 33, planar antenna member 31, and transmission plate 28. The shield lid 34 is grounded.

The shield lid 34 has an opening 36 formed at the center of the upper wall and connected to a waveguide tube 37. The waveguide tube 37 is connected to a microwave generation unit 39 for generating microwaves at one end through a matching circuit 38. The microwave generation unit 39 generates microwaves with a frequency of, e.g., 2.45 GHz, which are transmitted through the waveguide tube 37 to the planar antenna member 31. The microwaves may have a frequency of 8.35 GHz or 1.98 GHz.

The waveguide tube 37 includes a coaxial waveguide tube 37a having a circular cross-section and extending upward from the opening 36 of the shield lid 34, and a rectangular waveguide tube 37b connected to the upper end of the coaxial waveguide tube 37a through a mode transducer 40 and extending in a horizontal direction. Microwaves are propagated in a TE mode through the rectangular waveguide tube 37b, and are then turned into a TEM mode by the mode transducer 40 interposed between the rectangular waveguide tube 37b and coaxial waveguide tube 37a. The coaxial waveguide tube 37a includes an inner conductive body 41 extending at the center, which is connected and fixed to the center of the planar antenna member 31 at the lower end. Consequently, microwaves are efficiently and uniformly propagated from the inner conductive body 41 of the coaxial waveguide tube 37a in the radial direction to the planar antenna member 31.

The respective components of the plasma processing apparatus 100 are connected to and controlled by a process controller 50 comprising a CPU. The process controller 50 is connected to a user interface 51 including, e.g. a keyboard and a display, wherein the keyboard is used for an operator to input commands for operating the plasma processing apparatus 100, and the display is used for showing visualized images of the operational status of the plasma processing apparatus 100.

Further, the process controller 50 is connected to a storage section 52 that stores recipes containing control programs (software), process condition data, and so forth recorded therein, for the process controller 50 to control the plasma processing apparatus 100 so as to perform various processes.

A required recipe is retrieved from the storage section 52 and executed by the process controller 50 in accordance with an instruction or the like input through the user interface 51. Consequently, the plasma processing apparatus 100 can perform a predetermined process under the control of the process controller 50. The recipes containing control programs and process condition data may be used while they are stored in a computer readable storage medium, such as a CD-ROM, hard disk, flexible disk, or flash memory. Alternatively, the recipes may be used online while they are transmitted from another apparatus through, e.g., a dedicated line, as needed.

The plasma processing apparatus 100 structured as described above can proceed with a plasma process at a low temperature of 800° C. or less and to be free from damage on underlying films and so forth. Further, the apparatus 100 can provide good plasma uniformity to realize a uniform process.

In the plasma processing apparatus 100 of the RLSA type, a process for depositing a silicon nitride film on the surface of a wafer W may be performed by a plasma CVD method using the following sequence.

At first, the gate valve 26 is opened, and a wafer W is loaded through the transfer port 25 into the chamber 1 and placed on the worktable 2. Then, the nitrogen-containing gas and silicon-containing gas are supplied at predetermined flow rates from the nitrogen-containing gas supply source 17 and Si-containing gas supply source 18 of the gas supply system 16 through the gas feed members 15a and 15b into the chamber 1.

Then, microwaves are supplied from the microwave generation unit 39 through the matching circuit 38 into the waveguide tube 37. The microwaves are supplied through the rectangular waveguide tube 37b, mode transducer 40, and coaxial waveguide tube 37a in this order and through the inner conductive body 41 to the planar antenna member 31. Then, the microwaves are radiated from the slots (microwave radiation holes 32) of the planar antenna member 31 through the microwave transmission plate 28 into the space above the wafer W within the chamber 1. The microwaves are propagated in a TE mode through the rectangular waveguide tube 37b, and are then turned from the TE mode into a TEM mode by the mode transducer 40 and propagated in the TEM mode through the coaxial waveguide tube 37a to the planar antenna member 31. At this time, the microwave output is set to be 500 to 3,000 W, for example.

When the microwaves are radiated from the planar antenna member 31 through the transmission plate 28 into the chamber 1, an electromagnetic field is formed inside the chamber 1, and the nitrogen-containing gas and silicon-containing gas are thereby turned into plasma. Since microwaves are radiated from a number of slots (microwave radiation holes 32) of the planar antenna member 31, this microwave excitation plasma has a high density of about $1\times10^{10}$ to $5\times10^{12}/cm^3$, and a low electron temperature of about 1.5 eV or less near the wafer W. The microwave excitation plasma thus generated causes less plasma damage to the underlying films due to ions and so forth, and makes the source gas into a highly dissociated state in plasma by its high density. In this case, activated species of SiH, NH, N, and H are generated and react with each other to deposit a thin film of silicon nitride $Si_xN_y$ (wherein "x" and "y" are not necessarily determined by stoichiometry but take on different values depending on the conditions). Further, while a silicon nitride thin film is deposited, an RF power having a predetermined frequency of, e.g., 13.56 MHz is applied from the RF power supply 61 to the worktable 2. Thus, activated species containing nitrogen, such as NH and $N^+$, are easily drawn toward the wafer W. Consequently, the composition ratio of Si, N, and H in the silicon nitride film and their densities are changed, so that the silicon nitride film is formed to have a very high compressive stress.

Further, in this plasma processing apparatus 100, an RF power is applied from the RF power supply 61 to the susceptor 2, so that the low electron temperature of the plasma is maintained even when a bias is applied to the wafer W.

Next, an explanation will be given of this issue on the basis of data.

Figure 3:
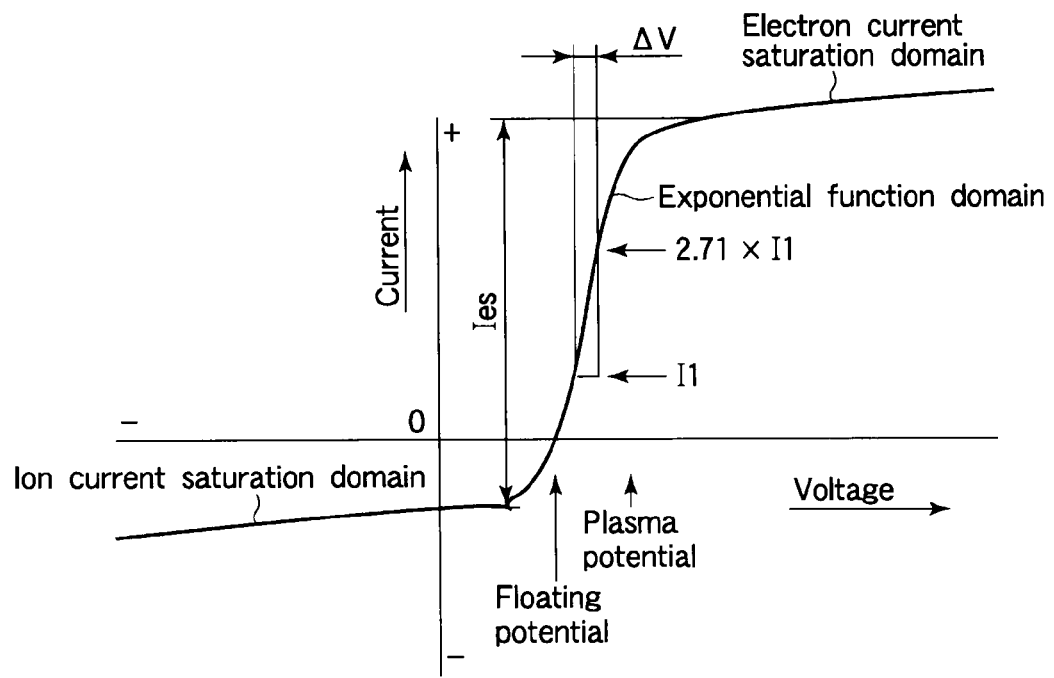
FIG. 3 This is a view showing a general electric current-voltage characteristic where an application voltage was swept while a Langmuir probe was inserted into plasma.

The electron temperature of plasma can be derived from the voltage-electric current characteristic shown in FIG. 3, which was obtained by sweeping an application voltage while a Langmuir probe was inserted into the plasma. Specifically, where an electric current value I1 is set at an arbitrary position within the exponential function domain in FIG. 3, an electron temperature (Te) is expressed by a voltage change $\Delta V$ that makes the electric current e-times (about 2.7 times). Accordingly, if the inclination in the exponential function domain is constant, the electron temperature is the same.

Figure 4:
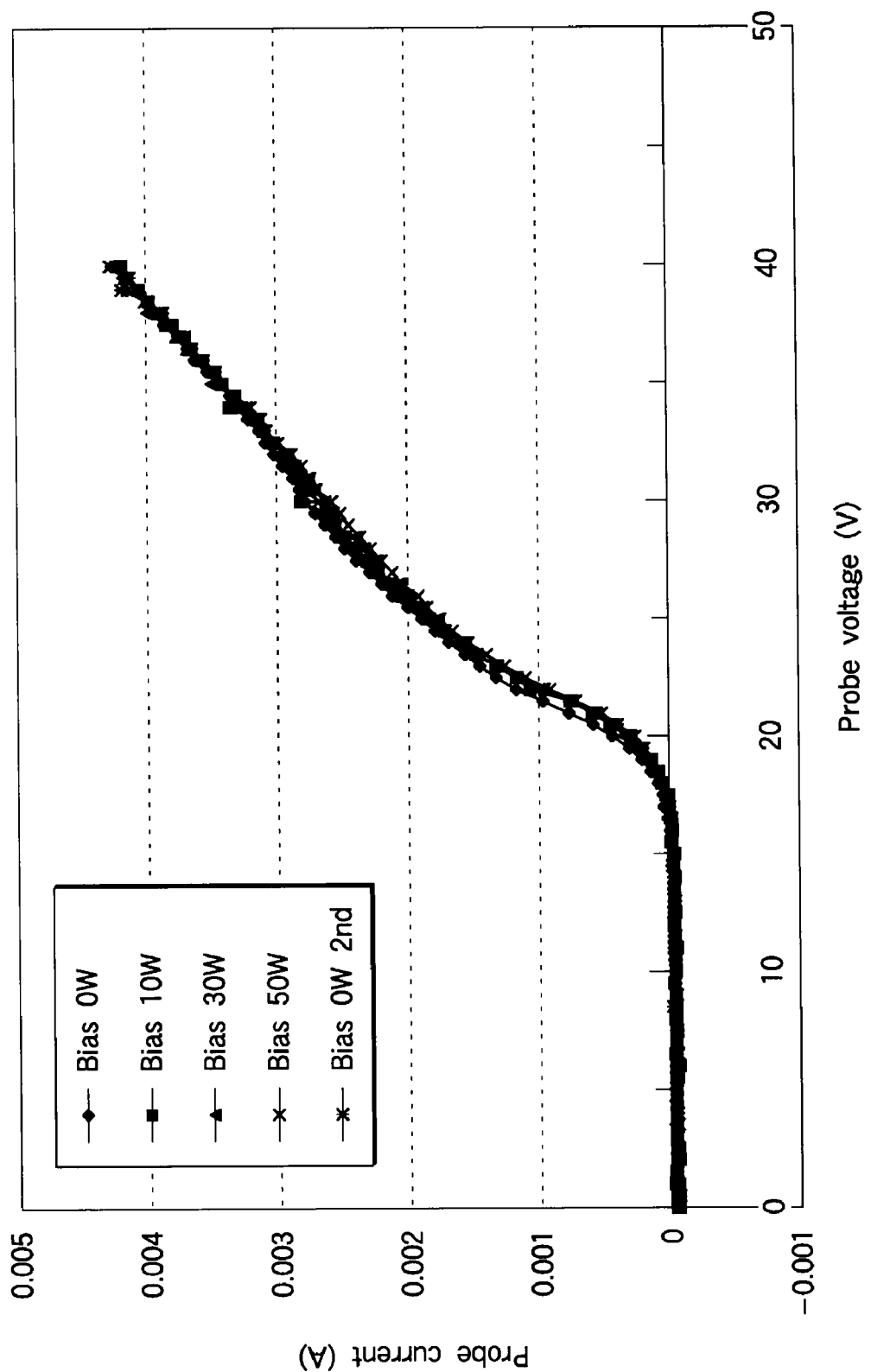
FIG. 4 This is a view showing an electric current-voltage characteristic where a bias power was changed.
Figure 5:
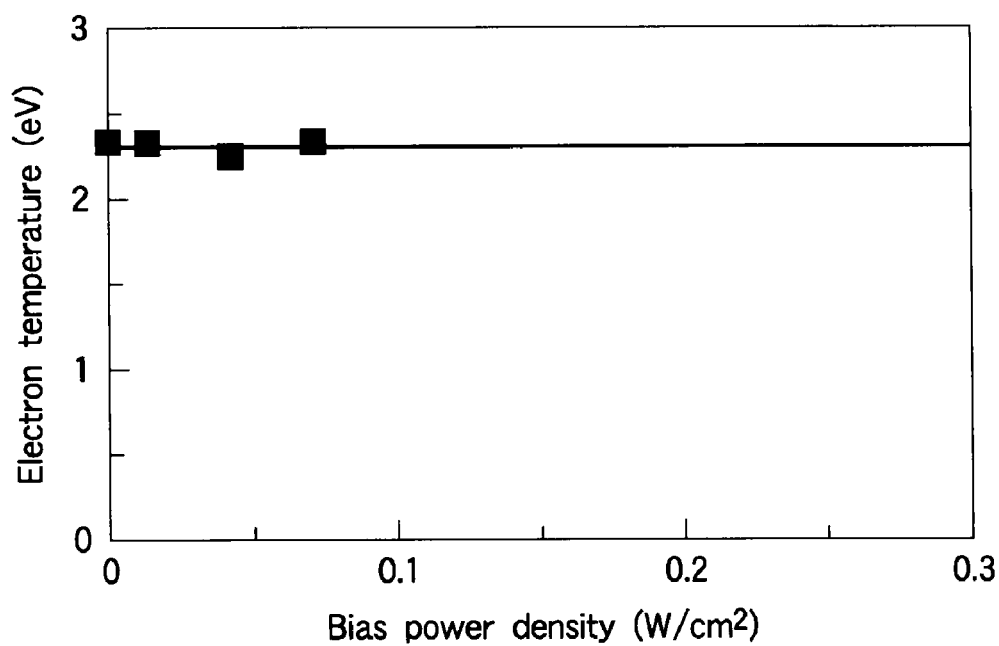
FIG. 5 This is a view showing the relationship between the bias power density and plasma electron temperature.

In light of this, in the plasma processing apparatus 100 shown in FIG. 1, a voltage-electric current characteristic was measured by the Langmuir probe while plasma was generated with different values of the RF bias applied to the susceptor. In this measurement, the bias power was set at different values of 0, 10, 30, and 50 W, while a 200-mm wafer was used, Ar gas was supplied at a flow rate of 250 mL/min (sccm), the pressure was set at 7.3 Pa, and the microwave power was set at 1,000 W. The electrode inside the susceptor had a surface area of 706.5 $cm^2$. FIG. 4 shows the results of this measurement. As shown in FIG. 4, the inclination of the exponential function domain was almost constant with a change in the bias power, and thus the electron temperature was also almost constant without depending on the bias power, as shown in FIG. 5, (FIG. 5 shows it as bias power density). Accordingly, even where an RF bias was applied to the wafer W at a power density of 0.015 to 1 $W/cm^2$, the low electron temperature characteristic of plasma can be maintained.

Consequently, where microwave plasma is generated as in this embodiment, an RF bias applied to a wafer W essentially does not cause damage to the wafer W due to ions and so forth because the electron temperature of the plasma is low.

In this respect, in the case of the parallel-plate type plasma, since the plasma sheath potential is high, the electron temperature is increased with an increase in the bias power (the basic electron temperature is as high as several tens eV).

According to the present invention, since an RF power is applied to the worktable 2 during plasma CVD, a silicon nitride film is formed to have a strong compressive stress without generating damage due to ions and forth. Particularly, even with film formation conditions for forming a silicon nitride film to have an ordinary tensile stress, where an RF power is applied to the worktable 2, the stress of the silicon nitride film to be formed is shifted toward the compressive stress side. This stress shift width, i.e., the absolute value of a change of the stress obtained by the RF power application, reaches 2,000 MPa or more, such as 3,000 to 4,500 MPa, where the film formation conditions other than the RF power application are set to be the same.

As described above, in a plasma CVD method according to the present invention, since an RF power is applied to the worktable 2, a silicon nitride film is formed to have a compressive stress regardless of the type of the film formation source gas. For example, where the nitrogen-containing gas is $NH_3$ gas, a silicon nitride film is formed to have a tensile stress, in general. However, where such film formation is performed with the RF bias condition (i.e., an RF power is applied to the worktable 2), a silicon nitride film is formed to have a strong compressive stress. Accordingly, such RF power application is effective as a factor for controlling the strength and direction (tensile or compressive state) of the stress. in this case, the power density (power per unit surface area) of the RF power applied to the worktable 2 is preferably set to be 0.0032 to 1-1.59 $W/cm^2$ (for example, it is 1 to 500 W where the electrode surface area is 314 $cm^2$), regardless of the type of the process gas.

The RF output for maximizing the compressive stress in the silicon nitride film falls within different ranges depending on the process pressure. For example, where the nitrogen-containing gas is $NH_3$ gas, and the silicon-containing gas is $Si_2H_6$ gas, the flow rate of $NH_3$ gas is set to be 100 to 3,000 mL/min (sccm), and preferably to be 400 to 1,000 mL/min (sccm), and the flow rate of $Si_2H_6$ gas is set to be 1 to 30 mL/min (sccm), and preferably to be 4 to 15 mL/min (sccm). Alternatively, for example, the nitrogen-containing gas is $N_2$ gas, and the silicon-containing gas is $Si_2H_6$ gas, the flow rate of $N_2$ gas is set to be 500 to 3,000 mL/min (sccm), and preferably to be 1,000 to 2,000 mL/min (sccm), and the flow rate of $Si_2H_6$ gas is set to be 1 to 30 mL/min (sccm), and preferably to be 4 to 15 mL/min (sccm). Of these gas combinations, where the nitrogen-containing gas is $N_2$ gas, and the silicon-containing gas is $Si_2H_6$ gas, hydrogen is decreased. Consequently, fluctuations of the stress are suppressed where a heat process is repeated in manufacturing various semiconductor devices, as compared to use of $NH_3$ gas and $Si_2H_6$ gas.

In the gas combination using $NH_3$ or $N_2$ described above, where a silicon nitride film having a compressive stress of 1,000 MPa or more is formed, for example, the process pressure is preferably set to be 0.1 Pa or more and 53 Pa or less.

Where a silicon nitride film having a compressive stress of 2,000 MPa or more is formed, for example, the process pressure is preferably set to be 0.1 Pa or more and 40 Pa or less.

Where a silicon nitride film having a compressive stress of 3,000 MPa or more is formed, for example, the process pressure is preferably set to be 5 Pa or more and 25 Pa or less. In this case, the RF power is preferably set to have a power density of 0.016 to 0.127 $W/cm^2$. For example, where the electrode surface area is 314 $cm^2$, the RF power is 5 to 40 W.

Where a silicon nitride film having a compressive stress of 3,500 MPa or more is formed, for example, the process pressure is preferably set to be 7 Pa or more and 16 Pa or less. In this case, the RF power is preferably set to have a power density of 0.032 to 0.096 $W/cm^2$. For example, where the electrode surface area is 314 $cm^2$, the RF power is 10 to 30 W.

Further, where the process pressure is constant, the silicon nitride film tends to have a stronger compressive stress with an increase in the process temperature of plasma CVD. In light of this, the worktable 2 is preferably heated at a temperature of 300° C. or more, and more preferably of 400 to 800° C.

Further, the compressive stress becomes stronger with an increase in the gap (the distance between the bottom surface of the transmission plate 28 and the top surface of the worktable 2) G in the plasma processing apparatus 100. In light of this, the gap G is preferably set to be about 100 to 350 mm, for example.

As described above, the plasma processing apparatus 100 is used to perform film formation while applying an RF bias under selected plasma CVD conditions, so that a silicon nitride film is formed to have a strong compressive stress. Further, for example, the process pressure is adjusted to control the degree of the stress.

Figure 6:
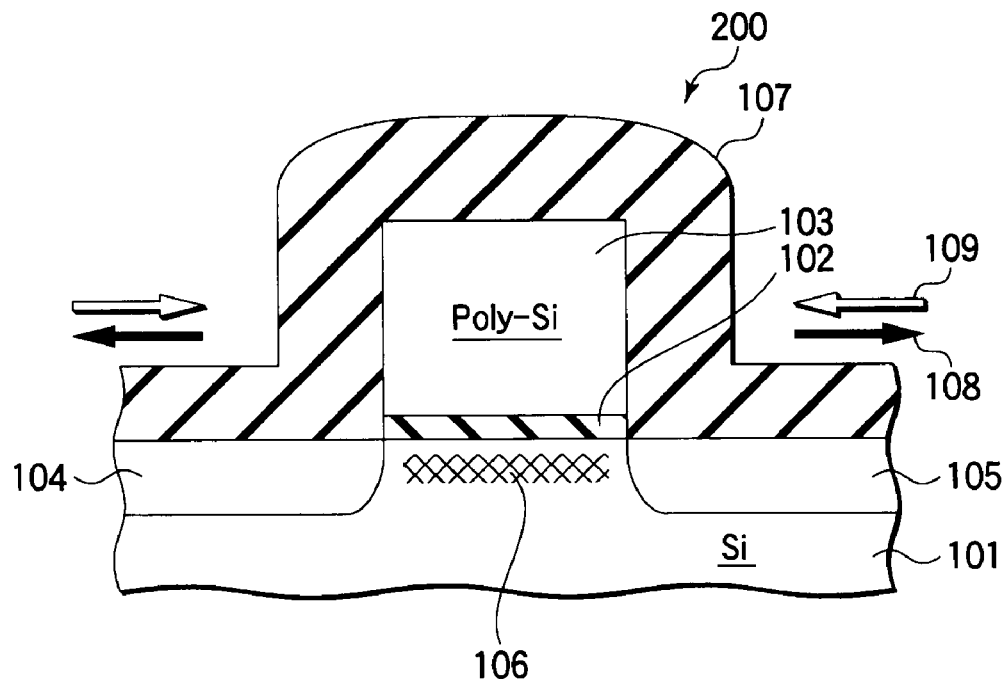
FIG. 6 This is a view schematically showing a cross section of an MOS transistor that uses a coating film formed of a silicon nitride film having a stress.

Next, with reference to FIGS. 6 and 7A to 7C, an explanation will be given of an example of application of a silicon nitride film formed by plasma CVD in the plasma processing apparatus 100. FIG. 6 is a view schematically showing a cross section of a transistor 200 having an MOS (Metal-Oxide-silicon) structure. The transistor 200 includes an Si layer 101 of the P-type or N-type, on which a gate electrode 103 made of, e.g., poly-silicon is formed through a gate insulating film 102. A source 104 and a drain 105 are formed in the layer 101 one on either side of the gate electrode 103, with a channel region 106 (the meshed portion in FIG. 6) interposed therebetween. A coating film (liner) 107 made of an insulating film is formed to cover the gate electrode 103. In this application example, the coating film 107 is formed by plasma CVD in the plasma processing apparatus 100. At this time, the plasma CVD conditions are controlled, so that the coating film 107 is formed to have a tensile stress or compressive stress, as described above. Particularly, a silicon nitride film having a strong compressive stress can be formed by selecting the RF bias condition and process pressure.

For example, where the coating film 107 is formed of a silicon nitride film having a tensile stress, the coating film 107 is provided with a stress in a direction indicated with a black arrow 108 in FIG. 6. In this case, the silicon of the source 104 and drain 105 adjacent to the coating film 107 are provided with a tensile stress in the same direction indicated with the black arrow 108. Consequently, the channel region 106 is also provided with a tensile stress in the same direction indicated with the black arrow 108, and so a tensile strain is generated in the channel region 106.

In reverse, where coating film 107 has a compressive stress, the coating film 107 is provided with a stress in a direction indicated with a white arrow 109 in FIG. 6. In this case, the silicon of the source 104 and drain 105 adjacent to the coating film 107 are provided with a compressive stress in the same direction indicated with the white arrow 109.
Consequently, the channel region 106 is also provided with a compressive stress in the same direction indicated with the white arrow 109, and so a compressive strain is generated in the channel region 106.

Where the transistor 200 is an NMOS transistor that uses electrons as carriers, a tensile strain applied to the channel region 106 increases the mobility while a compressive strain decreases the mobility. On the other hand, where the transistor 200 is a PMOS transistor that uses holes as carriers, a compressive strain applied to the channel region 106 increases the mobility while a tensile strain decreases the mobility.

Accordingly, where the transistor 200 is an NMOS transistor, the coating film 107 may be formed of a silicon nitride film having a tensile stress to generate a tensile strain in the channel region 106, so that the saturation drive electric current value and linear drive electric current value are increased. Alternatively, where the transistor 200 is a PMOS transistor, the coating film 107 may be formed of a silicon nitride film having a compressive stress to generate a compressive strain in the channel region 106, so that the saturation drive electric current value and linear drive electric current value are increased. In this way, the drive performance of the transistor 200 can be improved by use of a silicon nitride film having a tensile stress or compressive stress as the coating film 107.

In FIG. 6, a silicon nitride film having a stress is applied to the coating film 107. Alternatively, for example, a silicon nitride film having a stress may be applied to the sidewalls disposed on the both sides of the gate electrode 103.

Figure 7A:
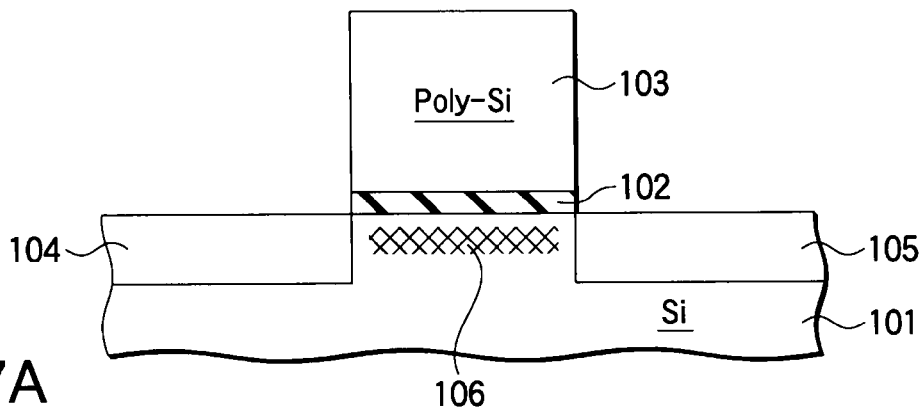
FIG. 7A This is a sectional view showing a step of a semiconductor device manufacturing method, to which a plasma CVD method according to an embodiment of the present invention is applied, and specifically showing a state before a silicon nitride film is formed.
Figure 7B:
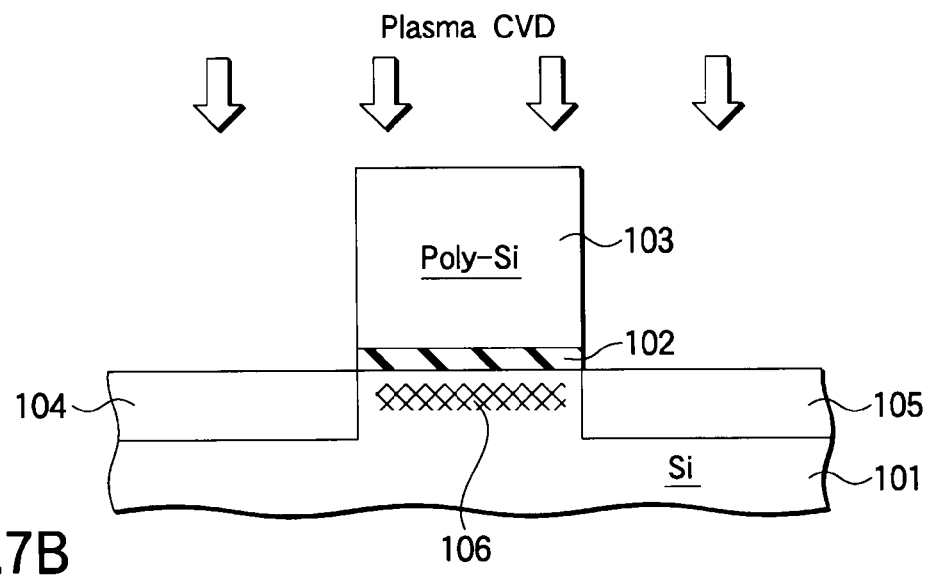
FIG. 7B This is a sectional view showing a step of the semiconductor device manufacturing method, to which a plasma CVD method according to an embodiment of the present invention is applied, and specifically showing a state while a plasma CVD process is performed.

For example, the transistor 200 is manufactured in the plasma processing apparatus 100 by forming the coating film 107 that covers the gate electrode 103 under conditions for generating a tensile stress or compressive stress. FIGS. 7A to 7B are views showing an example where a plasma CVD method according to the present invention is applied to part of the steps of manufacturing the transistor 200.

The transistor structure shown in FIG. 7A may be prepared by the following sequence. At first, a well (not shown) is formed in an Si layer 101 of the P-type or N-type, and a device isolation layer (not shown) is formed by, e.g., an LOCOS method or STI (Shallow Trench Isolation) method. Then, a gate insulating film 102, such as a silicon nitride film or silicon oxide film, is formed on the surface of the Si layer 101 by a process, such as a plasma process or heat process. Then, a poly-silicon layer is formed on the gate insulating film 102 by, e.g., CVD, and is etched by use of a mask pattern formed by a photolithography technique, to form a gate electrode 103. The gate electrode structure is not limited to a single layer of a poly-silicon layer, and it may be formed of a multi-layered structure containing a material selected from tungsten, molybdenum, tantalum, titanium, cobalt, nickel, their silicide, their nitride, and their alloy to decrease the resistivity of the gate electrode and thereby to increase the operation speed. After the gate electrode 103 is formed, a source 104 and a drain 105 are formed by ion implantation and activation processes.

Figure 7C:
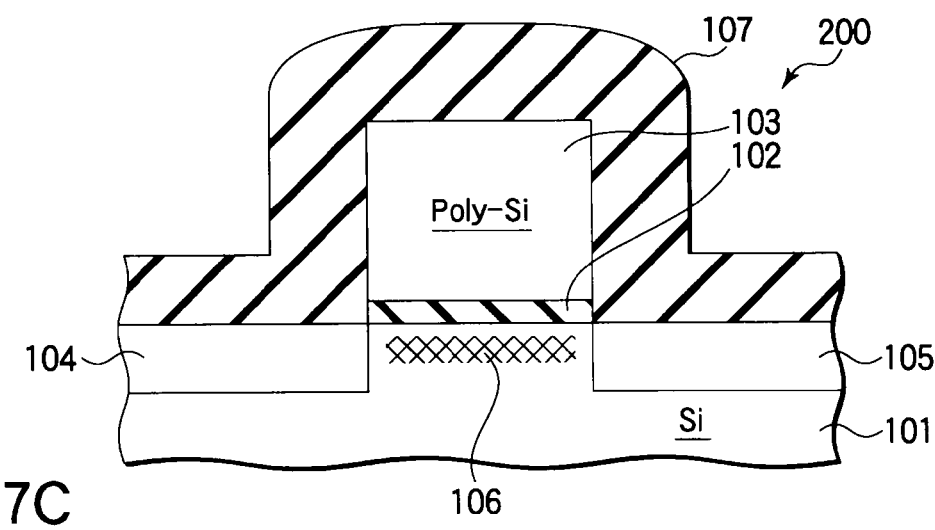
FIG. 7C This is a sectional view showing a step of the semiconductor device manufacturing method, to which a plasma CVD method according to an embodiment of the present invention is applied, and specifically showing a state after a silicon nitride film is formed to have a stress due to plasma CVD.

Then, as shown in FIG. 7B, in the plasma processing apparatus 100, a silicon nitride film is formed to cover the gate electrode 103 and the surface of the Si layer 101. At this time, the film formation reaction is caused while an RF power is applied to the worktable 2, so that the silicon nitride film is formed to have a strong compressive stress. Then, the unnecessary part of the silicon nitride film is removed by use of a mask pattern formed by a photolithography technique to form a coating film 107. Consequently, the transistor 200 having an MOS structure is formed, as shown in FIG. 7C. After the coating film 107 is formed, annealing may be performed, as needed.

Figure 8:
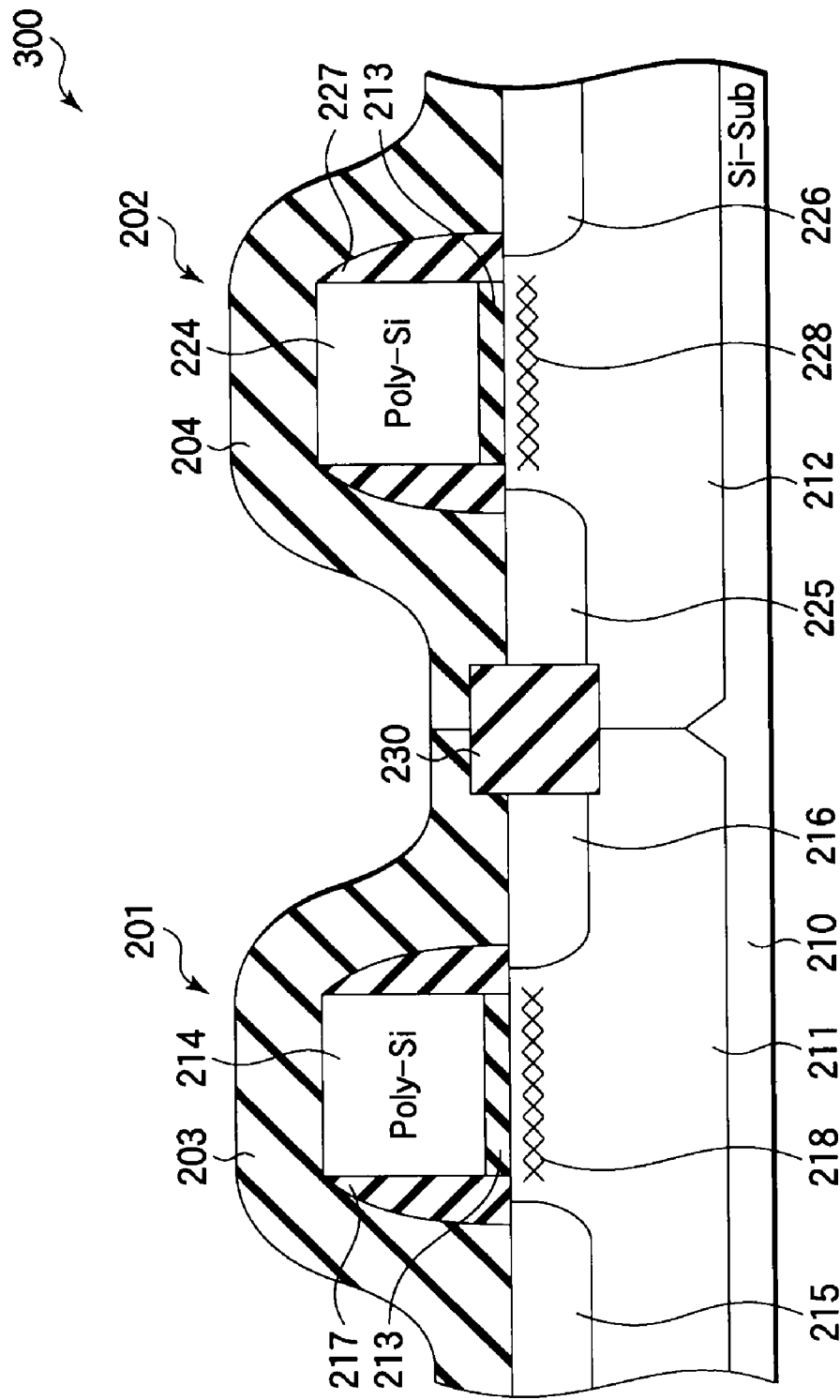
FIG. 8 This is a view schematically showing a cross section of a CMOS transistor that uses a coating film formed of a silicon nitride film having a stress.

FIG. 8 shows a CMOS transistor 300, which may be manufactured as follows. Specifically, film formation, photolithography patterning, and etching are sequentially performed, so that an NMOS area 201 and a PMOS area 202 are formed. Then, a silicon nitride film is formed under film formation conditions for generating a tensile stress or compressive stress according to the present invention. Then, the silicon nitride film is etched to form coating films 203 and 204 on the NMOS area 201 and PMOS area 202, respectively.

Specifically, a p-type well 211 used for the NMOS area 201 and an n-type well 212 used for the PMOS area 202 are formed in an silicon substrate 210. A gate insulating film 213 and a gate electrode 214 made of poly-Si are formed in this order on the main surface of the p-type well 211, and a source 215 and a drain 216 are formed one on either side of the gate electrode 214. Then, sidewalls 217 are formed on the opposite sides of the gate electrode 214. On the other hand, a gate insulating film 213 and a gate electrode 224 made of poly-Si are formed in this order on the main surface of the n-type well 212, and a source 225 and a drain 226 are formed one on either side of the gate electrode 224. Then, sidewalls 227 are formed on the opposite sides of the gate electrode 224. A reference symbol 230 indicates a device isolation region. At this time, the process sequence is performed basically in accordance with FIGS. 7A to 7C described above.

After the NMOS area 201 and PMOS area 202 are formed, a silicon nitride film having a tensile stress is deposited all over the surface in the plasma processing apparatus 100. Then, that part of the silicon nitride film having a tensile stress, which is present in the PMOS area 202, is removed by etching, so that a coating film 203 formed of the silicon nitride film having a tensile stress is left only in the NMOS area 201.

Then, a silicon nitride film having a compressive stress is deposited on the wafer W in the plasma processing apparatus 100. Then, that part of the silicon nitride film having a compressive stress, which is present in the NMOS area 201, is removed by etching, so that a coating film 204 formed of the silicon nitride film having a compressive stress is left only in the PMOS area 202. In this way, the stresses in the silicon nitride films are respectively utilized in the NMOS area 201 and PMOS area 202, such that a tensile strain is generated in the channel region 218 of the NMOS area 201 and a compressive strain is generated in the channel region 228 of the PMOS area 202. Consequently, a CMOS transistor with an improved performance is manufactured.

Figure 9:
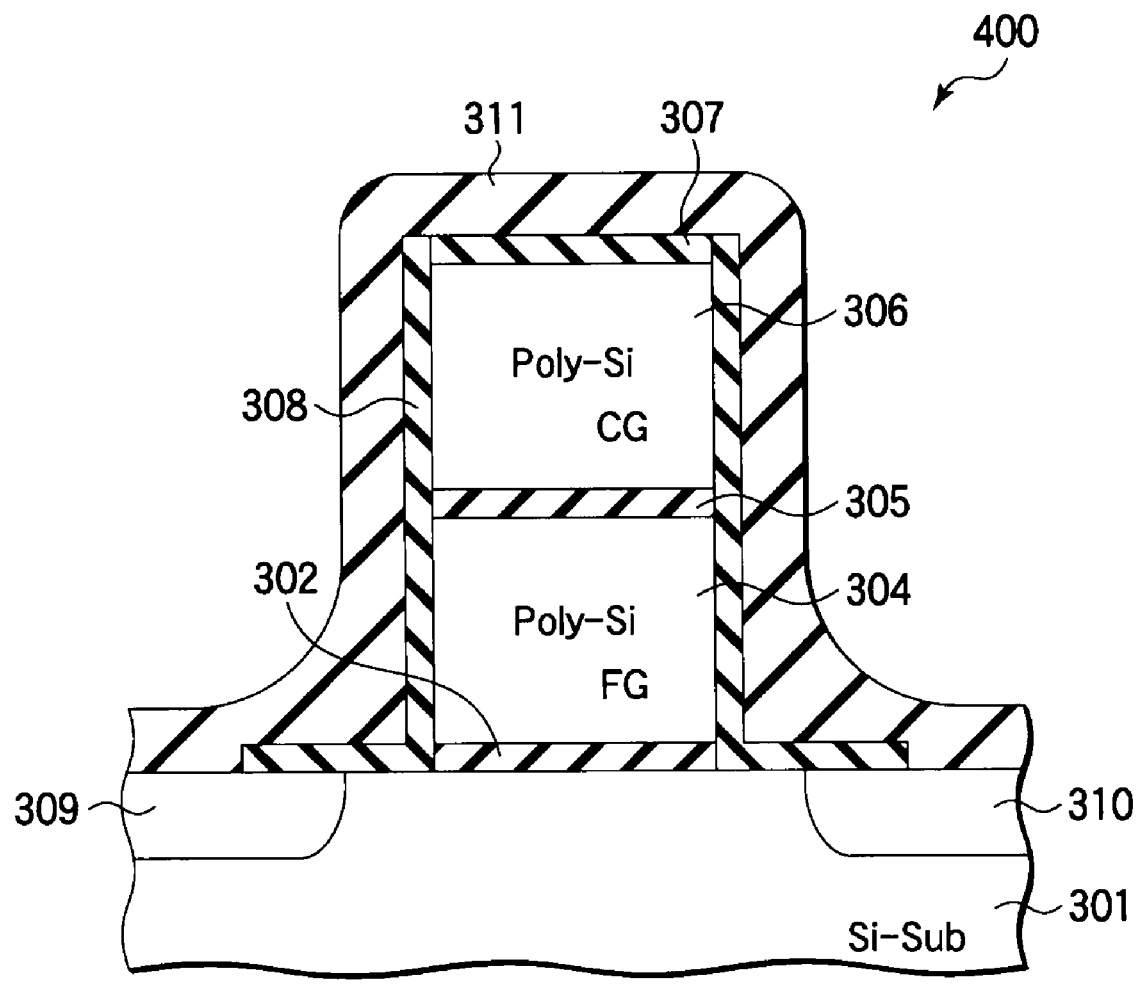
FIG. 9 This is a view schematically showing a cross section of a non-volatile memory that uses a coating film formed of a silicon nitride film having a stress.

FIG. 9 shows a non-volatile memory 400, to which a silicon nitride film formed by plasma CVD in the plasma processing apparatus 100 is applicable. In the non-volatile memory 400, a tunnel oxide film 302 and a floating gate (FG) 304 made of poly-silicon are formed in this order on the main surface of an Si substrate 301. A dielectric material film 305 having, e.g., an ONO structure formed of an oxide film, a nitride film, and an oxide film is formed on the floating gate 304. A control gate (CG) 306 made of poly-silicon is formed on the dielectric material film 305. An insulating layer 307 is formed on the control gate 306, and sidewall oxide films 308 are formed by an oxidation process on the sidewalls of the floating gate 304 and control gate 306. A source 309 and a drain 310 are formed in the main surface of the Si substrate 301 one on either side of the floating gate 304. A coating film 311 formed of a silicon nitride film having a stress is formed to cover the floating gate 304, control gate 306, source 309, and drain 310.

In this way, a suitable strain is applied to the floating gate 304 by forming a silicon nitride film having a stress as the coating film 311. Specifically, in general, non-volatile memories 400 of this kind entails a problem in that the floating gate 304 loses its electric charge by tunneling through the tunnel oxide film to the Si substrate (tunnel electric current), and so the data stored in the floating gate 304 disappears. In this respect, where a suitable strain is applied to the floating gate 304, the average electron mass and the barrier width of $SiO_2$ of the tunnel oxide film 302 are increased, so that the tunnel electric current is decreased, and the floating gate 304 can thereby stably retain its electric charge.

Next, an explanation will be given of results of experiments used as a basis of the present invention.

Figure 10:
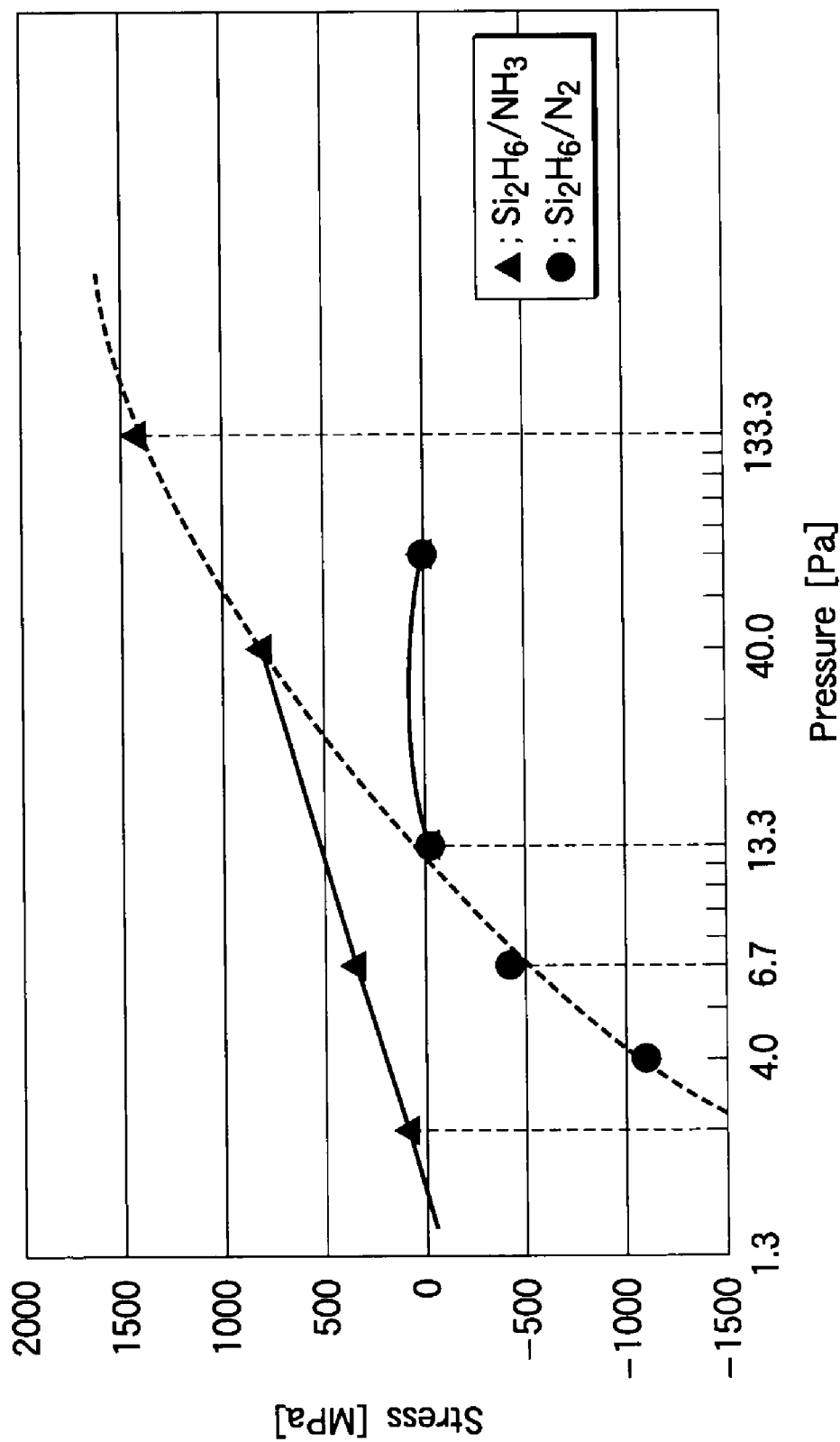
FIG. 10 This is a graph showing the relationship between the stress in a silicon nitride film and the pressure condition of plasma CVD.

FIG. 10 is a graph showing the relationship between the degree of stress in a silicon nitride film and the pressure condition of plasma CVD in the plasma processing apparatus 1. In an experiment, film formation was performed without an RF power applied to the worktable 2 to examine the influences of the gas type and pressure. In FIG. 10, the vertical axis denotes the degree of stress in a silicon nitride film, wherein the positive (plus) side represents tensile stress, and the negative (minus) side represents compressive stress (the same is applied to FIGS. 11 to 15).

In this experiment, the film formation was performed to form a silicon nitride film under the following plasma CVD conditions.

<Plasma CVD Film Formation Conditions>, ($NH_3/Si_2H_6$ Combination):

$NH_3$ gas flow rate; 500 mL/min (sccm),
$Si_2H_6$ gas flow rate; 5 mL/min (sccm),
Process pressure; 2.7 Pa (20 mTorr), 6.7 Pa (50 mTorr), 40.0 Pa (300 mTorr), and 133.3 Pa (1 Torr),
Temperature of worktable 2; 400° C., and
Microwave power; 2,000 W.

<Plasma CVD Film Formation Conditions>, ($N_2/Si_2H_6$ Combination):

$N_2$ gas flow rate; 1,100 mL/min (sccm),
$Si_2H_6$ gas flow rate; 1 mL/min (sccm),
Ar gas flow rate; 100 mL/min (sccm),
Process pressure; 4.0 Pa (30 mTorr), 6.7 Pa (50 mTorr), 13.3 Pa (100 mTorr), and 66.6 Pa (500 mTorr),
Temperature of worktable 2; 500° C., and
Microwave power; 3,000 W.

As shown in FIG. 10, where a silicon nitride film was formed by use of $NH_3$ as a nitrogen-containing gas, the film had a tensile stress. The tensile stress in a silicon nitride film formed by use of NH$_3$ tended to be higher with an increase in the process pressure. On the other hand, where a silicon nitride film was formed by use of N$_2$ as a nitrogen-containing gas, the film had a compressive stress. The compressive stress in a silicon nitride film formed by use of N$_2$ tended to be higher with a decrease in the process pressure.

Figure 11:
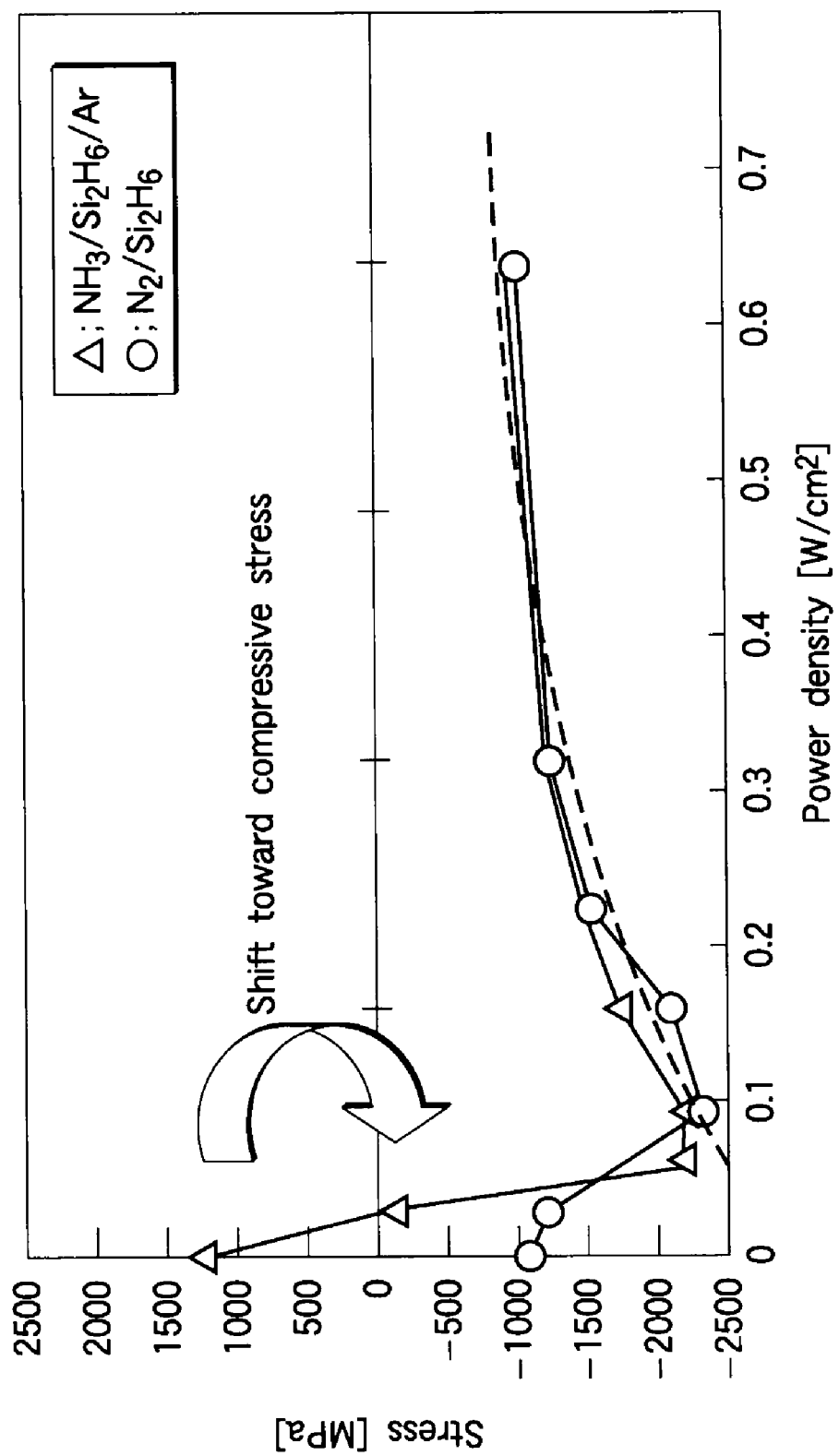
FIG. 11 This is a graph showing the relationship between the stress in a silicon nitride film and the RF power condition of plasma CVD.

In a subsequent experiment, film formation was performed with an RF power applied to the worktable 2, under the following plasma CVD conditions. FIG. 11 shows results of this experiment.

<Plasma CVD Film Formation Conditions 1>, (NH$_3$/Si$_2$H$_6$ Combination):
NH$_3$ gas flow rate; 400 mL/min (sccm),
Si$_2$H$_6$ gas flow rate; 5 mL/min (sccm),
Ar gas flow rate; 200 mL/min (sccm),
Process pressure; 133.3 Pa (1,000 mTorr),
Temperature of worktable 2; 500° C.,
Microwave power; 1,000 W,
RF frequency; 400 kHz, and
RF power; 0 W (no application), 10 W (power density: 0.032 W/cm$^2$), 20 W (power density: 0.064 W/cm$^2$), 30 W (power density: 0.095 W/cm$^2$), 50 W (power density: 0.159 W/cm$^2$), 70 W (power density: 0.223 W/cm$^2$), 100 W (power density: 0.318 W/cm$^2$), and 200 W (power density: 0.637 W/cm$^2$).

<Plasma CVD Film Formation Conditions 2>, (N$_2$/Si$_2$H$_6$ combination):
N$_2$ gas flow rate (gas feed member 15*a*); 1,100 mL/min (sccm),
Si$_2$H$_6$ gas flow rate; 5 mL/min (sccm),
N$_2$ gas flow rate (gas feed member 15*b*); 100 mL/min (sccm),
Process pressure; 2.7 Pa (20 mTorr),
Temperature of worktable 2; 500° C.,
Microwave power; 2,000 W,
RF frequency; 400 kHz, and
RF power; 0 W (no application), 10 W (power density: 0.032 W/cm$^2$), 20 W (power density: 0.064 W/cm$^2$), 30 W (power density: 0.095 W/cm$^2$), 50 W (power density: 0.159 W/cm$^2$), 70 W (power density: 0.223 W/cm$^2$), 100 W (power density: 0.318 W/cm$^2$), and 200 W (power density: 0.637 W/cm$^2$).

As confirmed by comparison of FIG. 10 with FIG. 11, as regards a silicon nitride film formed by use of an NH$_3$/Si$_2$H$_6$ combination gas as a film formation source gas, in which a tensile stress is supposed to be generated under ordinary film formation conditions, a large compressive stress was generated by use of a predetermined RF bias condition. On the other hand, as regards a silicon nitride film formed by use of an N$_2$/Si$_2$H$_6$ combination gas as a film formation source gas, in which a compressive stress is supposed to be generated under ordinary film formation conditions, a larger compressive stress was generated by use of a predetermined RF bias condition. Further, as shown in FIG. 11, in either case of using an NH$_3$/Si$_2$H$_6$ combination gas or N$_2$/Si$_2$H$_6$ combination gas as a source gas, the relationship between the stress in a silicon nitride film and the RF output was rendered similar.

Specifically, where the electrode surface area of the bias electrode was set at 314 cm$^2$ and the RF power was set to be 10 to 200 W, a silicon nitride film having a compressive stress of 1,000 MPa or more was formed. Particularly, where the electrode surface area was set at 314 cm$^2$ and the RF power was set to be 20 to 40 W, a silicon nitride film having a strong compressive stress of 2,000 MPa or more was formed. From these results, it has been confirmed that the RF bias condition defined by an RF power density is preferably set to be 0.032 to 0.637 W/cm$^2$, and more preferably set to be 0.064 to 0.127 W/cm$^2$. By use of this range, a silicon nitride film having a compressive stress is formed regardless of the type of the film formation source gas.

Further, the compressive stress was maximized at an RF bias condition defined by a power density of about 0.095 W/cm$^2$ (electrode surface area: 314 cm$^2$ and RF power: about 30 W). Thus, it is thought that the RF power applied to the worktable 2 is preferably set to be 0.1 to 100 W, and more preferably to be 0.1 to 40 W. Accordingly, the power range defined by a power density is preferably set in accordance with the electrode surface area to generate a large compressive stress.

In a subsequent experiment, a silicon nitride film was formed under the following conditions, and the influence of the pressure on the stress was examined in the case of using the RF bias condition. In this experiment, an N$_2$/Si$_2$H$_6$ combination and an NH$_3$/Si$_2$H$_6$ combination were used as follows.

<Plasma CVD Conditions >
(1) N$_2$/Si$_2$H$_6$ Combination:
N$_2$ gas flow rate (gas feed member 15*a*); 1,100 mL/min (sccm),
Si$_2$H$_6$ gas flow rate; 3 mL/min (sccm),
N$_2$ gas flow rate (gas feed member 15*b*); 100 mL/min (sccm),
Process pressure; 2.67 Pa (20 mTorr), 13.3 Pa (100 mTorr), and 66.6 Pa (500 mTorr),
Temperature of worktable 2; 500° C.,
Microwave power; 3,000 W,
RF frequency; 13.56 Hz, and
RF power; 0 W (no application), 10 W (power density: 0.032 W/cm$^2$), 20 W (power density: 0.064 W/cm$^2$), 30 W (power density: 0.095 W/cm$^2$), and 50 W (power density: 0.159 W/cm$^2$).

(2) NH$_3$/Si$_2$H$_6$ Combination:
NH$_3$ gas flow rate; 400 mL/min (sccm),
Si$_2$H$_6$ gas flow rate; 3 or 5 mL/min (sccm),
Ar gas flow rate; 200 mL/min (sccm), Process pressure; 2.67 Pa (20 mTorr), 13.3 Pa (100 mTorr), and 66.6 Pa (500 mTorr),
Temperature of worktable 2; 400° C.,
Microwave power; 3,000 W,
RF frequency; 400 Hz, and
RF power; 0 W (no application), 10 W (power density: 0.032 W/cm$^2$), 20 W (power density: 0.064 W/cm$^2$), 30 W (power density: 0.095 W/cm$^2$), and 50 W (power density: 0.159 W/cm$^2$).

Figure 12:
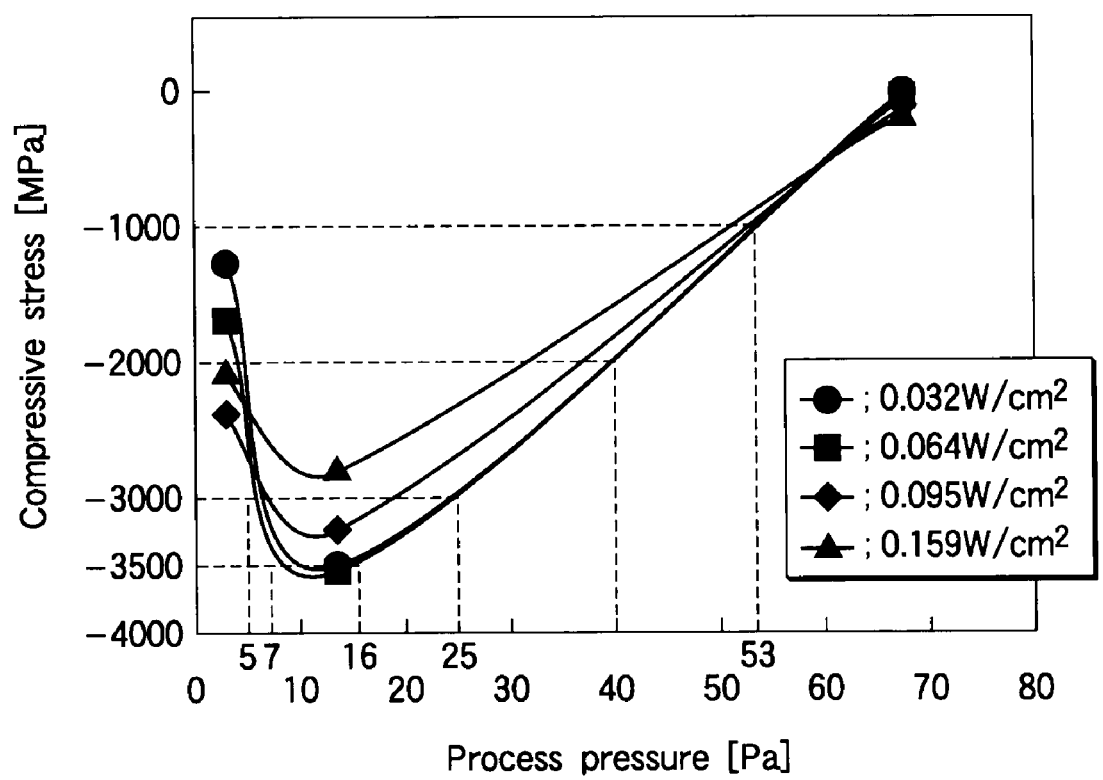
FIG. 12 This is a graph showing the relationship between the stress in a silicon nitride film and the process pressure of plasma CVD where an $N_2/Si_2H_6$ combination was used as a process gas.
Figure 13:
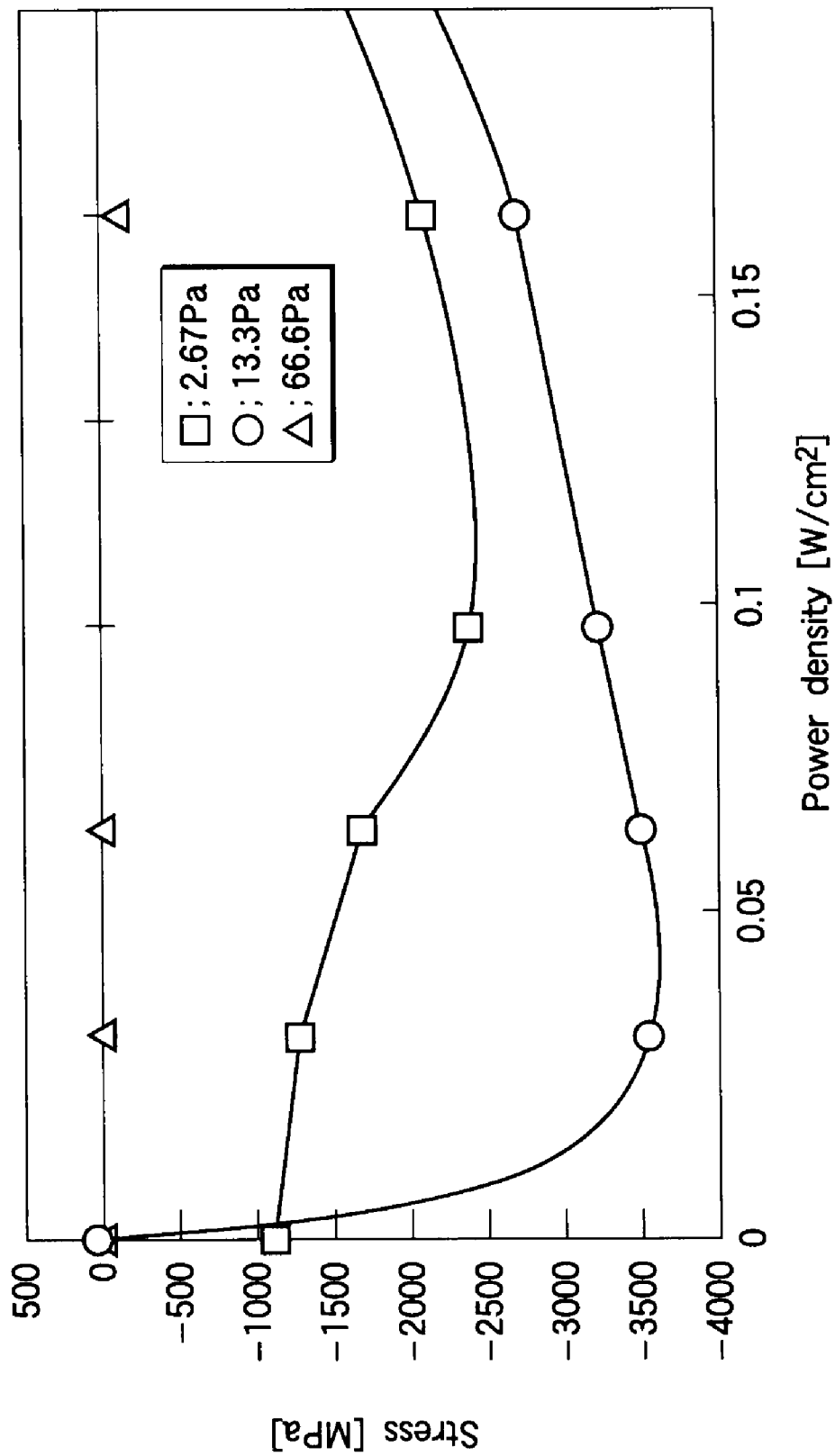
FIG. 13 This is a graph showing the relationship between the stress in a silicon nitride film and the RF power condition of plasma CVD with different values of the process pressure where an $N_2/Si_2H_6$ combination was used as a process gas.
Figure 14:
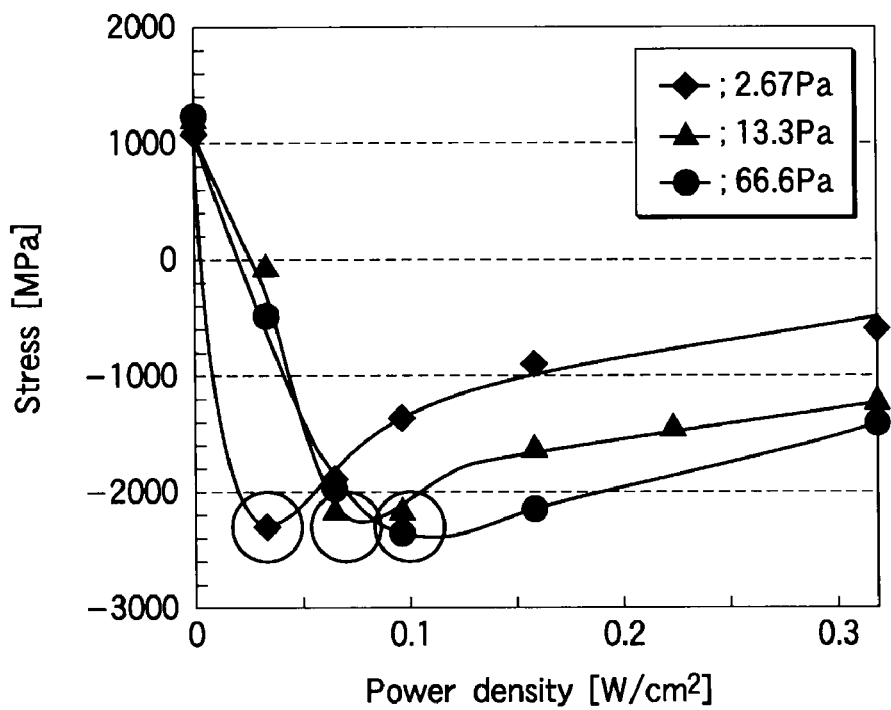
FIG. 14 This is a graph showing the relationship between the stress in a silicon nitride film and the RF power condition of plasma CVD with different values of the process pressure where an $NH_3/Si_2H_6$ combination was used as a process gas.

FIGS. 12 and 13 show results concerning the N$_2$/Si$_2$H$_6$ combination, and FIG. 14 shows results concerning the NH$_3$/Si$_2$H$_6$ combination.

As shown in FIG. 12, in the case of using the gas combination containing N$_2$, a silicon nitride film having a compressive stress of 1,000 MPa or more was formed where the process pressure was set to be, e.g., 0.1 Pa or more and 53 Pa or less. Further, a silicon nitride film having a compressive stress of 2,000 MPa or more was formed where the process pressure was set to be, e.g., 0.1 Pa or more and 40 Pa or less. Further, a silicon nitride film having a compressive stress of 3,000 MPa or more was formed where the process pressure was set to be, e.g., 5 Pa or more and 25 Pa or less. In these cases, the RF power was preferably set to be 5 to 40 W. Further, a silicon nitride film having a compressive stress of 3,500 MPa or more was formed where the process pressure was set to be, e.g., 7 Pa or more and 16 Pa or less. In this case, the RF power was preferably set to be 10 to 30 W. Accordingly, the RF power density for bias application is preferably set to be 0.016 to 0.127 W/cm$^2$, and more preferably to be 0.032 to 0.095 W/cm$^2$.

Further, as shown in FIG. 13, in the case of using a process pressure of 13.3 Pa (100 mTorr), a silicon nitride film having a strong compressive stress of 3,500 MPa was formed where the RF power density was set to be about 0.032 to 0.095 W/cm$^2$ (RF power: 10 to 30 W). Further, in the case of using a process pressure of 2.67 Pa (20 mTorr), a silicon nitride film having a compressive stress exceeding 2,000 MPa was formed where the RF power density was set to be about 0.095 to 0.127 W/cm$^2$ (RF power: 30 to 40 W). On the other hand, in the case of using a process pressure of 66.6 Pa (500 mTorr), a silicon nitride film having a compressive stress was not formed even where the RF power was supplied.

In the case of using the $NH_3/Si_2H_6$ combination, as shown in FIG. 14, the compressive stress was maximized at different values of the RF power density depending on the process pressure. With an increase in the process pressure, the power density for obtaining the maximum compressive stress tended to be higher.

Figure 15:
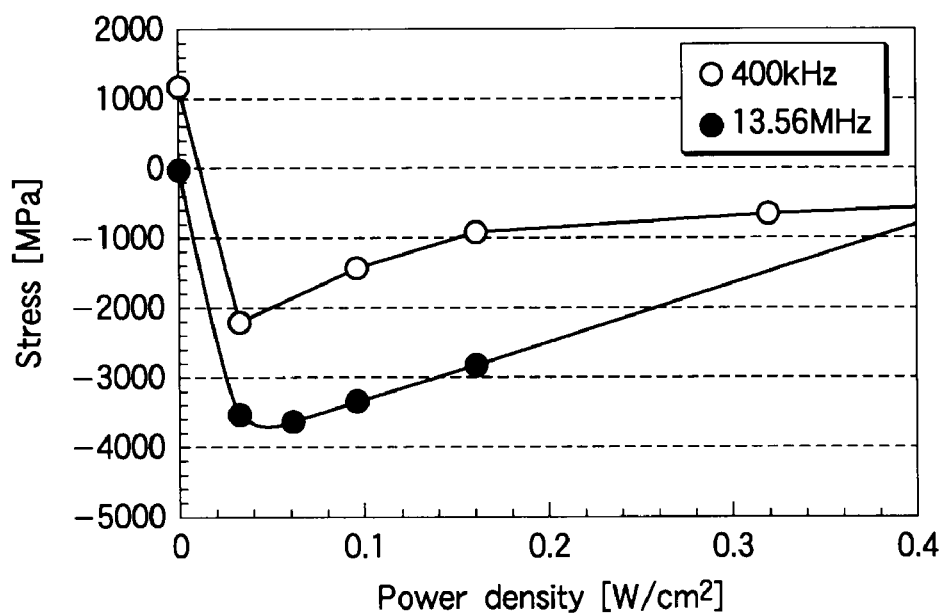
FIG. 15 This is a graph showing the relationship between the stress in a silicon nitride film and the RF power condition of plasma CVD to compare a frequency of 400 kHz with a frequency of 13.56 MHz.

In a subsequent experiment, the influence of the frequency of the RF power applied to the worktable 2 was examined. In this experiment, while the process pressure was set at 13.3 Pa (100 mTorr) and the frequency of the RF power applied to the worktable 2 was set at 400 kHz and 13.56 MHz, the RF power density was set at different values to measure the stress in a silicon nitride film. FIG. 15 shows results of this experiment. As shown in FIG. 15, use of 13.56 MHz rendered a larger compressive stress.

Next, an explanation will be given of results of experiments for confirming effects of the present invention.

(1) Heat Resistance Examination

A silicon nitride film having a tensile stress or compressive stress was formed in the plasma processing apparatus 100, and was subjected to annealing. As regards the heat process thus performed, the influence thereof on the stress in the silicon nitride film was examined. The film formation conditions and annealing conditions were set as follows.

<Plasma CVD Conditions ($NH_3/Si_2H_6$ Combination)>
$NH_3$ gas flow rate; 400 mL/min (sccm),
$Si_2H_6$ gas flow rate; 5 mL/min (sccm),
Process pressure; 133.3 Pa (1,000 mTorr),
Temperature of worktable 2; 500° C., and
Microwave power; 1 kW.
<Plasma CVD Conditions ($N_2/Si_2H_6$ Combination)>
$N_2$ gas flow rate (gas feed member 15*a*); 1,100 mL/min (sccm),
$Si_2H_6$ gas flow rate; 5 mL/min (sccm),
$N_2$ gas flow rate (gas feed member 15*b*); 100 mL/min (sccm),
Process pressure; 2.7 Pa (20 mTorr),
Temperature of worktable 2; 500° C., and
Microwave power; 1 kW.
<Annealing Conditions>
Process temperature; 800° C.,
Process pressure; 101, 308 Pa, and
Process time; 10 minutes, 20 minutes, and 30 minutes.

Figure 16:
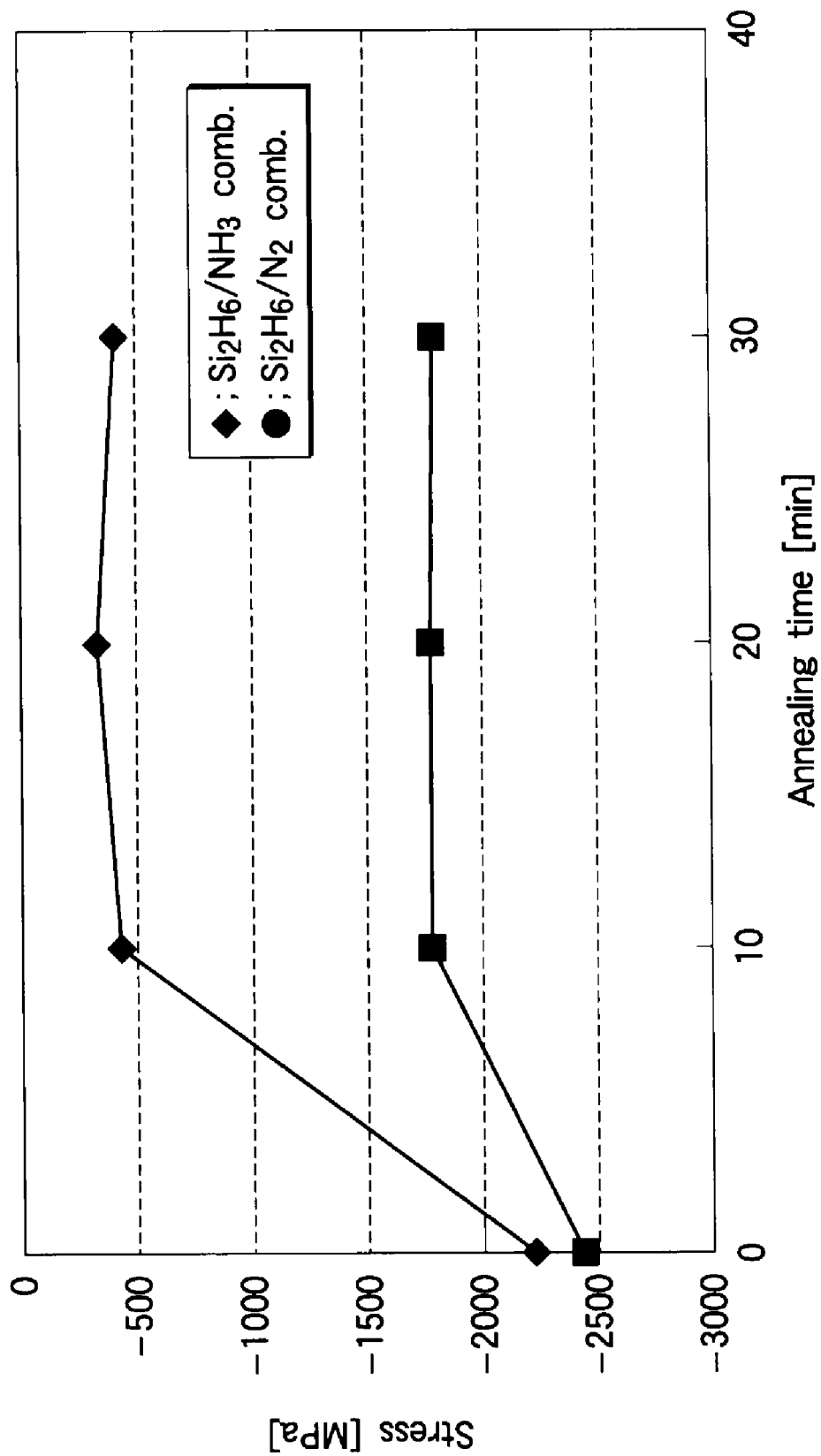
FIG. 16 This is a graph showing the relationship between the stress in a silicon nitride film and the annealing time.

FIG. 16 shows the relationship between the stress in a silicon nitride film and the annealing time. As shown in FIG. 16, a silicon nitride film having a compressive stress formed by use of $Si_2H_6$ and $N_2$ as a source gas under the conditions described above rendered a far smaller fluctuation width between stresses obtained before and after the annealing and thus was better in heat resistance, as compared to a silicon nitride film having a compressive stress formed by use of $Si_2H_6$ and $NH_3$ under the conditions described above. Judging from these results, it has been confirmed that, where plasma CVD is performed by use of $Si_2H_6$ and $N_2$ as a source gas and an RF bias is applied, a film is formed with a decreased amount of hydrogen contained therein, so that a silicon nitride film can be formed to maintain a high stress while providing a high resistance to heat processes, which are repeated performed in manufacturing various semiconductor devices.

The present invention is not limited to the embodiment described above, and it may be modified in various manners without departing from the spirit or scope of the present invention.

For example, in the embodiment described above, a silicon nitride film having a tensile stress or compressive stress is applied to the coating film (liner) of a transistor to improve its drive characteristics. However, this is not limiting, and the present invention is applicable to manufacturing of various semiconductor devices in which the device characteristics can be improved by use of stress.

The invention claimed is:

1. A plasma CVD chemical vapor deposition method for forming a silicon nitride film, the method comprising:
preparing a plasma processing apparatus which comprises a process chamber configured to be vacuum-exhausted, a worktable equipped with an electrode and configured to place a target substrate thereon inside the process chamber, a microwave generation source configured to generate microwaves, a planar antenna including a plurality of slots and configured to supply the microwaves generated by the microwave generation source through the slots into the process chamber, a gas supply mechanism configured to supply a film formation source gas into the process chamber, and an RF radio frequency power supply configured to apply an RF power to the electrode of the worktable;
placing the target substrate on the worktable;
supplying $N_2$ gas and $Si_2H_6$, gas into the process chamber, turning the $N_2$ gas and the $Si_2H_6$ gas into plasma by the microwaves, and depositing the silicon nitride film on a surface of the target substrate by use of the plasma, under a process pressure of 0.1 Pa or more and 53 Pa or less; and
causing the silicon nitride film to have a predetermined compressive stress of 1,000 MPa or more by applying the RF power having a frequency of 400 kHz to 27 MHz to the electrode of the worktable at a power density of 0.0032 to 0.637 W/cm$^2$ to apply an RF bias to the target substrate, while depositing the silicon nitride film.

2. The plasma CVD method according to claim 1, wherein the predetermined compressive stress is set at a value of 2,000 MPa or more.

3. The plasma CVD method according to claim 1, wherein the predetermined compressive stress is set at a value of 3,000 MPa or more.

4. The plasma CVD method according to claim 1, wherein the predetermined compressive stress is set at a value of 3,500 MPa or more.

5. The plasma CVD method according to claim 1, wherein the method is arranged to use a process temperature of 300° C. to 800° C. in depositing the silicon nitride film.

6. The plasma CVD method according to claim 2, wherein the process pressure is set at a value of 0.1 Pa or more and 40 Pa or less.

7. The plasma CVD method according to claim 3, wherein the process pressure is set at a value of 5 Pa or more and 25 Pa or less.

8. The plasma CVD method according to claim 3, wherein the power density is set at a value of 0.016 to 0.127 W/cm$^2$.

9. The plasma CVD method according to claim 4, wherein the process pressure is set at a value of 7 Pa or more and 16 Pa or less.

10. The plasma CVD method according to claim 4, wherein the RF power density is set a value of 0.032 to 0.095 W/cm$_2$.

11. A semiconductor device manufacturing method comprising
preparing a structure including a gate electrode formed on an insulating film on a main surface of a semiconductor substrate, and a source and a drain formed in the main surface one on either side of the gate electrode, and
forming a silicon nitride film to cover the gate electrode and the source and drain,
wherein the silicon nitride film is formed by a method comprising:
preparing a plasma processing apparatus which comprises a process chamber configured to be vacuum-exhausted, a worktable equipped with an electrode and configured to place a target substrate thereon inside the process chamber, a microwave generation source configured to generate microwaves, a planar antenna including a plurality of slots and configured to supply microwaves generated by the microwave generation source through the slots into the process chamber, a gas supply mechanism configured to supply a film formation source gas into the process chamber, and an RF radio frequency power supply configured to apply an RF power to the electrode of the worktable;
placing the target substrate on the worktable;
supplying N$_2$ gas and Si$_2$H$_6$ gas into the process chamber, turning the N$_2$ gas and the Si$_2$H$_6$ gas into plasma by the microwaves, and depositing the silicon nitride film on a surface of the target substrate by use of the plasma, under a process pressure of 0.1 Pa or more and 40 Pa or less; and
causing the silicon nitride film to have a predetermined compressive stress of 1,000 MPa or more by applying an RF power having a frequency of 400 kHz to 27 MHz to the electrode of the worktable at a power density of 0.0032 to 0.637 W/cm$^2$ to apply an RF bias to the target substrate, while depositing the silicon nitride film.

12. A non-transitory storage medium that stores a program for execution on a computer to control a plasma processing apparatus which comprises a process chamber configured to be vacuum-exhausted, a worktable equipped with an electrode and configured to place a target substrate thereon inside the process chamber, a microwave generation source configured to generate microwaves, a planar antenna including a plurality of slots and configured to supply microwaves generated by the microwave generation source through the slots into the process chamber, a gas supply mechanism configured to supply a film formation source gas into the process chamber, and an RF radio frequency power supply configured to apply an RF power to the electrode of the worktable,
wherein, when executed, the program causes the computer to control the plasma processing apparatus to conduct a plasma CVD chemical vapor deposition method comprising:
placing the target substrate on the worktable;
supplying N$_2$ gas and Si$_2$H$_6$ gas into the process chamber, turning the N$_2$ gas and the Si$_2$H$_6$ gas into plasma by the microwaves, and depositing the silicon nitride film on a surface of the target substrate by use of the plasma, under a process pressure of 0.1 Pa or more and 40 Pa or less; and
causing the silicon nitride film to have a predetermined compressive stress of 1,000 MPa or more by applying the RF power having a frequency of 400 kHz to 27 MHz to the electrode of the worktable at a power density of 0.0032 to 0.637 W/cm$^2$ to apply an RF bias to the target substrate, while depositing the silicon nitride film.

13. A plasma processing apparatus comprising:
a process chamber configured to be vacuum-exhausted;
a worktable equipped with an electrode and configured to place a target substrate thereon inside the process chamber;
a microwave generation source configured to generate microwaves;
a planar antenna including a plurality of slots and configured to supply microwaves generated by the microwave generation source through the slots into the process chamber;
a gas supply mechanism configured to supply a film formation source gas into the process chamber;
an RF radio frequency power supply configured to apply an RF power to the electrode of the worktable; and
a control section configured to control an operation of the plasma processing apparatus and including a computer and a non-transitory storage medium that stores a program for execution on the computer,
wherein, when executed, the program causes the computer to control the plasma processing apparatus to conduct a plasma CVD (chemical vapor deposition) sequence for forming a silicon nitride film, the sequence comprising:
placing the target substrate on the worktable;
supplying N$_2$ gas and Si$_2$H$_6$ gas into the process chamber, turning the N$_2$ gas and the Si$_2$H$_6$ gas into plasma by the microwaves, and depositing the silicon nitride film on a surface of the target substrate by use of the plasma, under a process pressure of 0.1 Pa or more and 53 Pa or less; and
causing the silicon nitride film to have a predetermined compressive stress of 1,000 MPa or more by applying the RF power having a frequency of 400 kHz to 27 MHz to the electrode of the worktable at a power density of 0.0032 to 0.637 W/cm$^2$ to apply an RF bias to the target substrate, while depositing the silicon nitride film.

* * * * *